(12) United States Patent
Mizumura et al.

(10) Patent No.: US 6,254,415 B1
(45) Date of Patent: Jul. 3, 2001

(54) ZERO INSERTION FORCE ELECTRICAL CONNECTOR

(75) Inventors: Akinori Mizumura, Yamato; Atsuhito Noda, Hachiohji, both of (JP)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 09/454,145

(22) Filed: Dec. 3, 1999

(30) Foreign Application Priority Data

Dec. 5, 1998 (JP) .................................. 10-361867

(51) Int. Cl.⁷ .......................... H01R 4/50; H01R 13/625

(52) U.S. Cl. ............................................. 439/342

(58) Field of Search .................... 439/342, 259, 439/268, 263, 264

(56) References Cited

U.S. PATENT DOCUMENTS 5,569,045 * 10/1996 Hsu ..................................... 439/342

* cited by examiner

*Primary Examiner*—Brian Sircus
*Assistant Examiner*—Javaid Nasri
(74) *Attorney, Agent, or Firm*—Robert A. Yesukevich

(57) ABSTRACT

A socket for a pin grid-array package includes a base housing having terminals arranged in the same grid pattern as the lead pins of the pin grid-array package and a cover mounted on the base housing for slidable movement relative to the base housing. The cover has through holes therein for receiving the lead pins of the pin grid-array package therethrough. The cover is movable relative to the base housing between a first, pin-insertion position and a second, contact-engagement position. An actuator for the socket may include structure to stop rotation of the actuator and permit insertion of the actuator into the socket only when the actuator is positioned in certain angular orientations.

28 Claims, 23 Drawing Sheets

ZERO INSERTION FORCE ELECTRICAL CONNECTOR

CROSS-REFERENCE TO RELATED APPLICATION

U.S. patent application Ser. No. 09/454,144 filed Dec. 3,1999, and entitled "ZERO INSERTION FORCE ELECTRICAL CONNECTOR".

FIELD OF THE INVENTION

The present invention relates generally to an electrical connector and, more particularly, to a socket and actuator for connecting a pin grid-array ("PGA") package to a circuit member.

BACKGROUND OF THE INVENTION

A typical PGA package includes a silicon chip, a package including conductive and non-conductive components and a plurality of pins in a grid array depending downward from a bottom surface of the package. Conventionally, sockets for PGA packages include a plate-like base housing having a plurality of terminals arranged in the same grid pattern as the lead pins of the PGA package and a plate-like cover member having a plurality of through holes in the same grid pattern as the lead pins of the pin grid-array package, thus permitting the lead pins to be inserted in the through holes. The plate-like cover member is slidably positioned on the upper surface of the base housing. Some examples of such sockets are shown in Japanese Patent Application Laid-Open No. 7-142134 and Japanese Registered Utility Model No. 2-536440.

The base housing and cover are slidably interconnected so that the cover is driven in a plane parallel to the underlying base housing between a first position in which the lead pins of the PGA package can pass through the through holes of the cover to reach the terminals mounted in the underlying base housing without requiring any insertion force to be applied to the lead pins and a second position in which the lead pins of the PGA package contact the terminals.

A variety of terminal structures have been proposed as appropriate for use in such sockets. Some such terminals are configured such that their contact portions engage the lead pins of a PGA package upon movement of the cover of the socket, as shown in Japanese Patent Application Laid-Open No. 7-142134 and Japanese Registered Utility Model No. 2-536440 referred to above. Conversely, some terminals are configured such that the lead pins of a PGA package are brought to the contact portions of terminals in the base housing as shown in Japanese Patent Application Laid-Open No. 9-185981.

Essentially all of the terminals have contact portions located in the terminal-receiving cavities of the base housing of the socket, and most have straight pin-like solder tails extending from the bottom of the base housing of the socket. These pin-like solder tails are inserted into through holes of a printed circuit board on which the socket is mounted, and are soldered to the printed circuit board.

The base housing typically has some type of drive mechanism formed thereon for slidably moving the cover over the underlying base housing. In some sockets, a cam is rotatably attached to one lateral side or end of the base housing, and the cam is adapted to be rotated with an associated handle, thereby permitting the cam axle to push or pull the cover over the underlying base housing. The handle may be rotated from a horizontal position in which it is parallel to the base housing to a vertical position in which it is perpendicular to the base housing.

The demand for ever smaller electronic devices has driven the demand for smaller components that make up the electronic devices. However, customers also desire increasing performance from these smaller devices. Thus, component designers must continue to shrink their designs while still improving their performance and ease of use.

SUMMARY OF THE INVENTION

In view of the above one object of the present invention is to provide a small-sized socket structure for a pin grid-array package.

Another object of the present invention is to provide a zero insertion force electrical connector for mounting on a circuit member and receiving a device having a pin terminal array. The electrical connector includes a base housing and a cover. The base housing has an upper surface and a lower surface and a plurality of terminal-receiving cavities arranged in a terminal-receiving cavity array generally corresponding to the pin terminal array. The cover is mounted on the upper surface of the base housing and is movable relative to the base housing between a first pin insertion position and a second pin engagement position. One of the cover and the base housing may have a metal component adjacent an end thereof. The metal component has an opening for receiving an actuator therein and a metal component stop member adjacent the opening.

A plurality of conductive terminals are provided with one of the terminals being mounted in each cavity. A rotatable actuator is also provided and is operable to slide the cover relative to the base housing between the first insertion position and the second engagement position. The actuator has an actuator stop member configured to engage the metal component stop member upon rotation of the actuator in order to prevent rotation of the actuator past a predetermined angular position and thus limit linear motion of the cover relative to the base housing.

The base housing may include a metal component extending along one end of the base housing and being spaced from the terminal-receiving cavities. Such metal component includes an opening therein configured for engagement by the actuator. The metal component may further include arms extending along opposite sides of the base housing with the arms spaced from the terminal-receiving cavities. The cover may include guide structure that interacts with edges of the base member to guide the cover between the first insertion position and the second engagement position.

The cover may include a generally planar layer of sheet metal and a generally planar layer of insulative material. In addition, the cover may also include a second metal component which extends along one end of the cover and is spaced from the through holes. This metal component could include a cam follower surface configured to engage the socket actuator. The actuator may be a metal component. The metal component stop member may be a projection on the cover adjacent the opening and the projection may extend into the opening.

Another object of the present invention is to provide a socket similar to that described above but wherein the socket does not include a metal component with an opening therein. The actuator has an axis of rotation generally perpendicular to the plane of the cover and further includes an actuator stop member configured to engage the stop projection upon rotation of the actuator in order to prevent rotation of the actuator past a predetermined angular position and thus limit linear motion of the cover relative to the base housing.

Another object of the present invention is to provide still another socket similar to that described above and wherein the one of the cover and base housing further include a mounting region for receiving an actuator thereat. The actuator and the mounting region include orientation structure to prevent the actuator from being inserted into the mounting region when the actuator is oriented at certain predetermined angular orientations.

Still another object of the present invention is to provide a socket similar to that described above but wherein the actuator and mounting region include securing structure to secure the actuator to one of the cover and base housing within the mounting region without any additional components. The actuator may include at least one projection to secure the actuator to the base housing.

BRIEF DESCRIPTION OF THE DRAWINGS

Other objects and advantages of the present invention will be understood from the following description of a socket according to one preferred embodiment of the present invention, which is shown in accompanying drawings.

DETAILED DESCRIPTION OF PREFERRED EMBODIMENT

Figure 1:
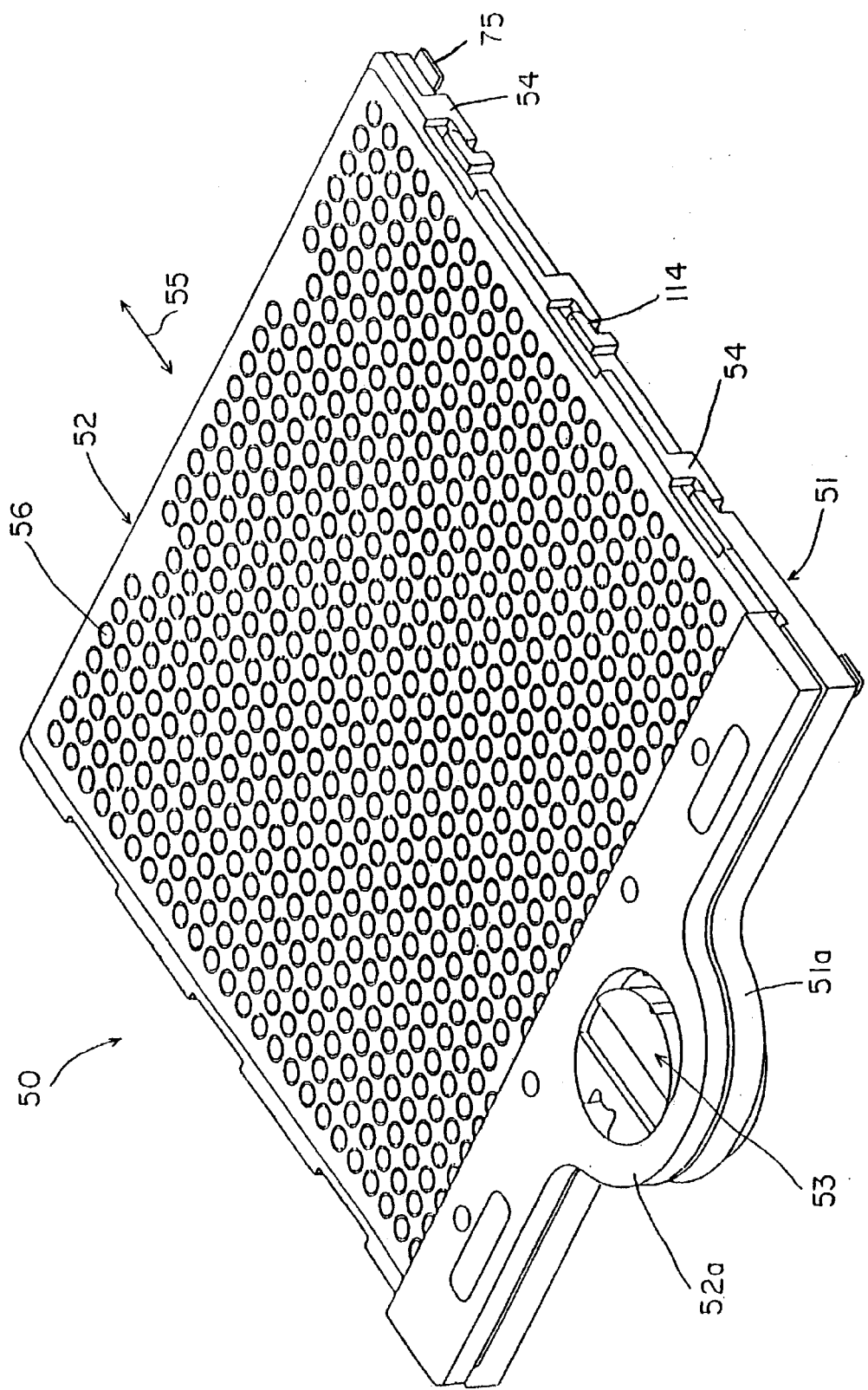
FIG. 1 is a perspective view of a socket for a PGA package according to the present invention.

Referring to FIG. 1, a socket 50 for a PGA package comprises a plate-like base housing 51 and an overlying plate-like slide member or cover 52. The plate-like cover 52 slidably moves in a plane parallel to the plane of the underlying plate-like base housing 51.

The base housing 51 and cover 52 have semicircular extensions 51a and 52a formed on respective lateral sides or ends thereof with holes therein for receiving an eccentric cam member or actuator 53 to provide drive means for driving the cover 52 linearly along base housing 51. The eccentric cam member 53 is as tall as the total thickness of the base housing 51 and cover 52, so that the upper and lower surfaces of the cam 53 are flush with the upper surface of the cover 52 and the lower surface of the base housing 51, respectively. The cover 52 has L-shaped guide pieces 54 integrally formed on its opposite longitudinal sides for guiding the movement of cover 52 in the direction indicated by double-headed arrow 55.

As seen from the Figures, the cover 52 has a plurality of through holes 56 arranged in the same grid pattern as the lead pins 118 of the PGA package 117 (FIGS. 45 and 46) which socket 50 is designed to receive, thus permitting the lead pins to be inserted in the through holes 56. The underlying base housing 51 has terminal-receiving cavities provided in a one-to-one corresponding relationship with the through holes 56 of the overlying cover 52. Each terminal-receiving cavity has a terminal 57 press-fit therein. As discussed in greater detail below, the terminals 57 are configured to engage the lead pins 118 of PGA package 117 when it is mounted on the socket and the cover 52 is in its contact engagement position.

Figure 2:
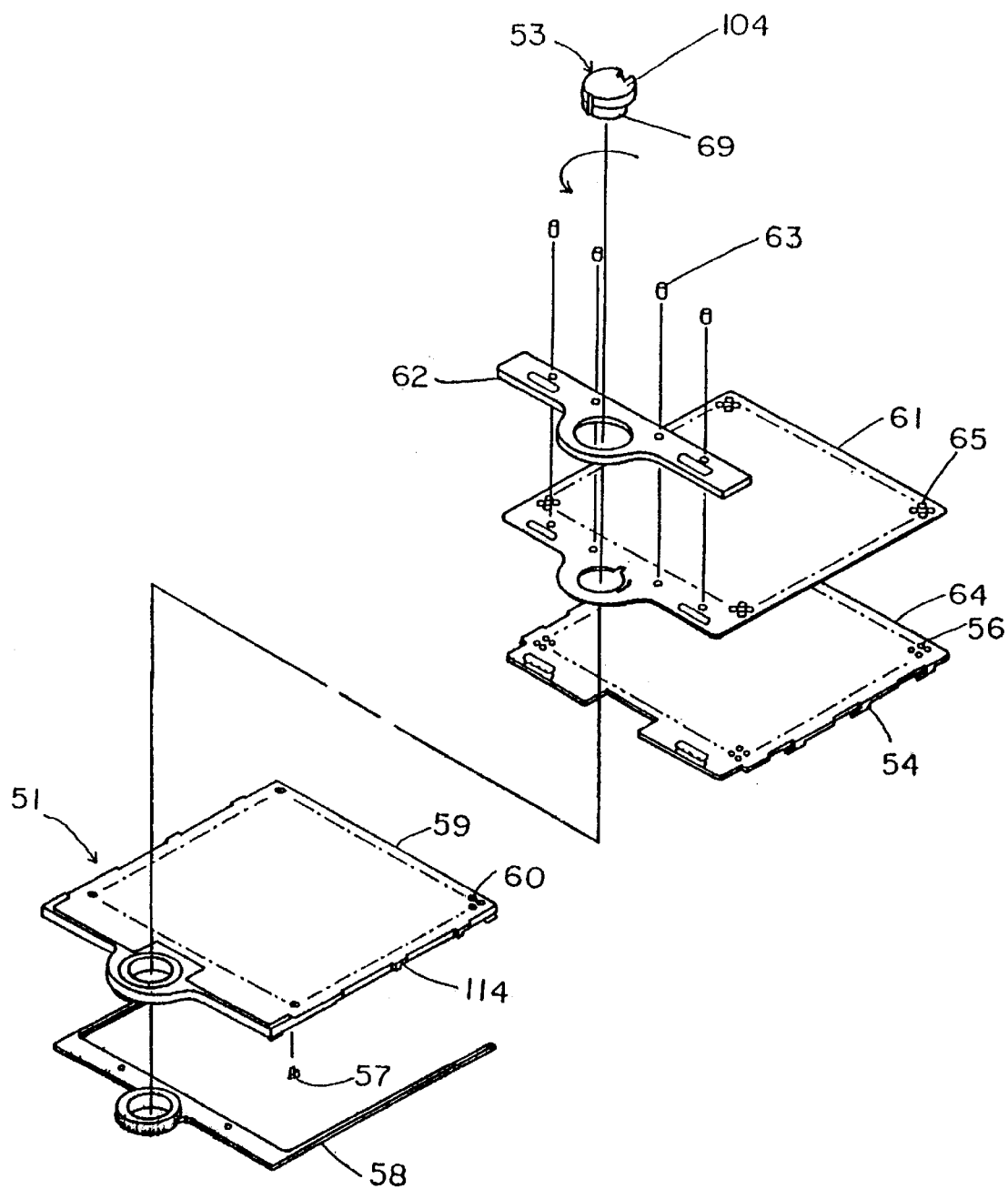
FIG. 2 is a schematic view of the socket.

FIG. 2 is a schematic exploded perspective view of socket 50, and is illustrated in this manner for the sake of facilitating the understanding of the structure thereof. The plastic molded parts or insulative components 59 and 64 of base housing 51 and cover 52, respectively, are not separate components that are assembled with other components to form the base housing and cover. Instead, they are plastic components that are molded around metal components of the base housing and cover. Thus, the plastic portions of the base housing 51 and cover 52 never exist as the separate components shown in FIG. 2.

The base housing 51 is a generally rectangular or square molded plate or base housing insulative components 59 of insulating plastic or resin material which has a metal frame 58 as its core. The square molded plate 59 has terminal-receiving holes or cavities 60 arranged in the form of a lattice. Each cavity has a terminal 57 press-fit therein from its bottom side.

Similarly, the slide cover 52 is a generally rectangular or square molded plate or cover insulative component 64 of insulating plastic or resin material having a square metal plate stiffener or cover metal 61 embedded therein as its core. As described in greater detail below, the metal plate stiffener 61 has a metal upper cam plate 62 fixed to the top surface of the square metal stiffener 61 by metal pins 63 at one lateral side of the stiffener. The upper cam plate 62 is thicker than the metal plate stiffener 61. The metal plate stiffener 61 has apertures 65 located in the lattice pattern of the pins of the PGA package, and the molded plate 64 has through holes 56 in registration with the apertures 65 of the metal plate stiffener 61.

Figure 3:
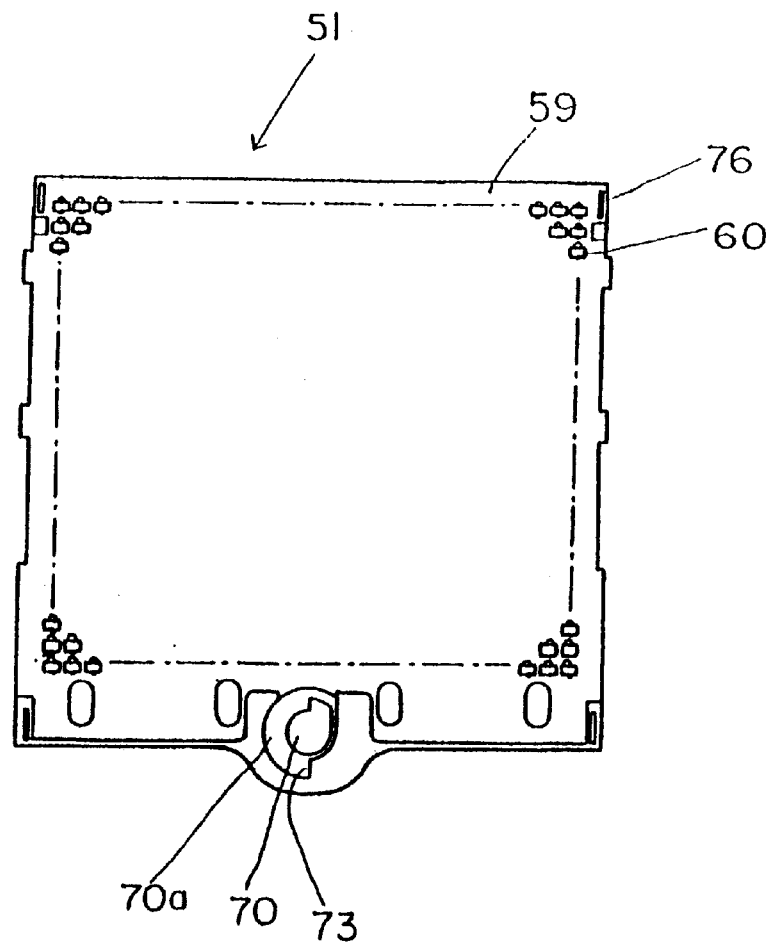
FIG. 3 is a top plan view of a base housing.
Figure 4:
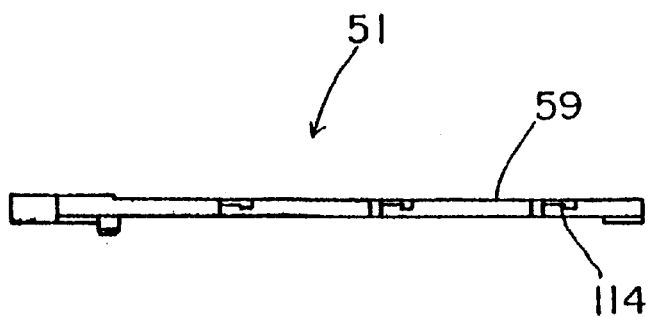
FIG. 4 is a side elevational view of the base housing.
Figure 5:
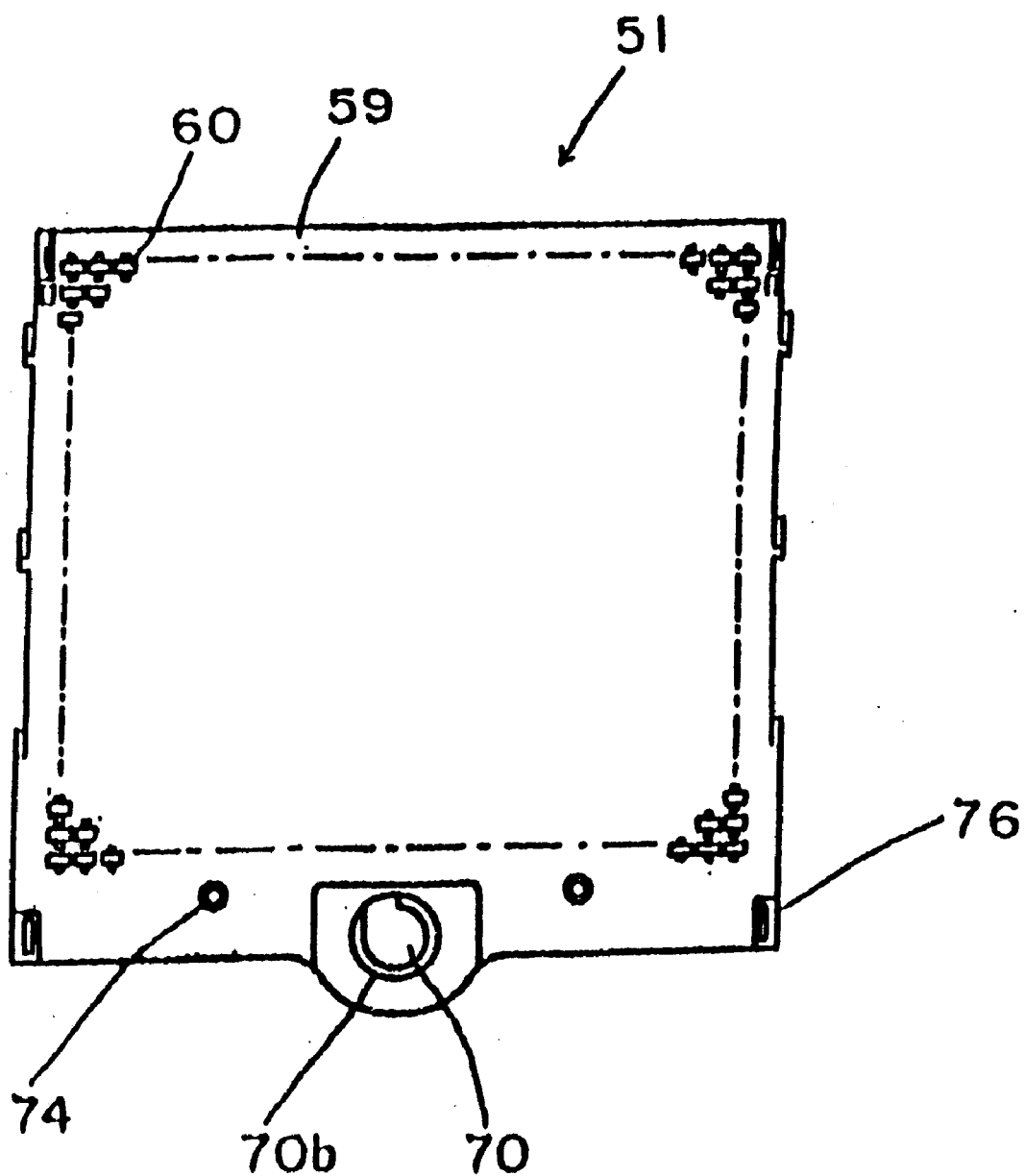
FIG. 5 is a bottom plan view of the base housing.
Figure 6:
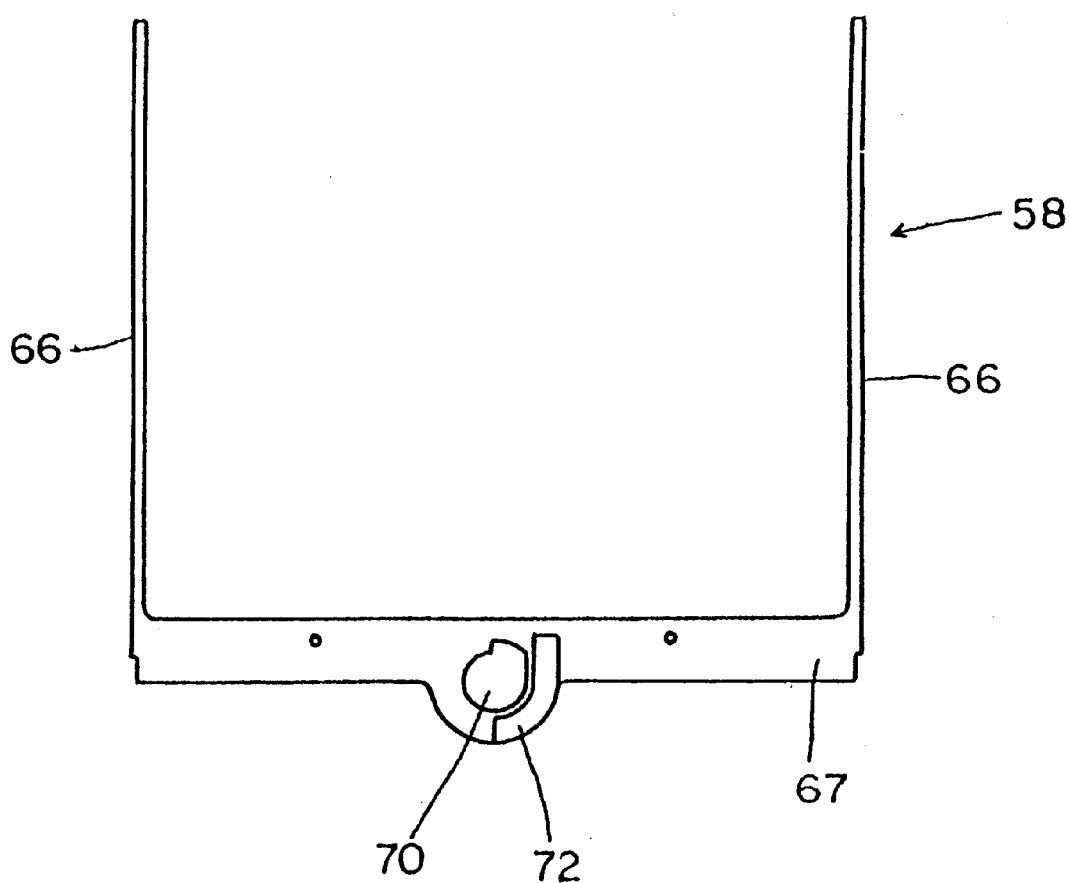
FIG. 6 is a top plan view of one example of a metal frame for the base housing.
Figure 7:
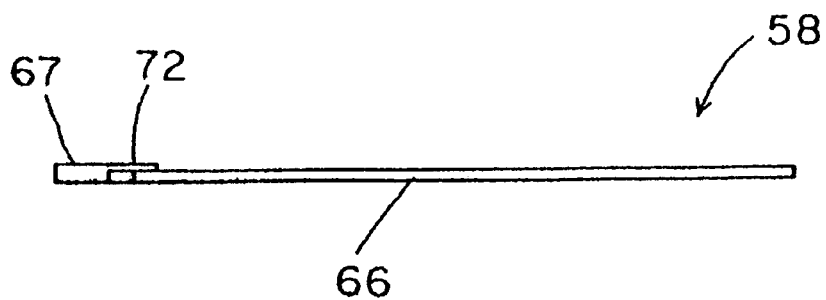
FIG. 7 is a side elevational view of the metal frame.
Figure 8:
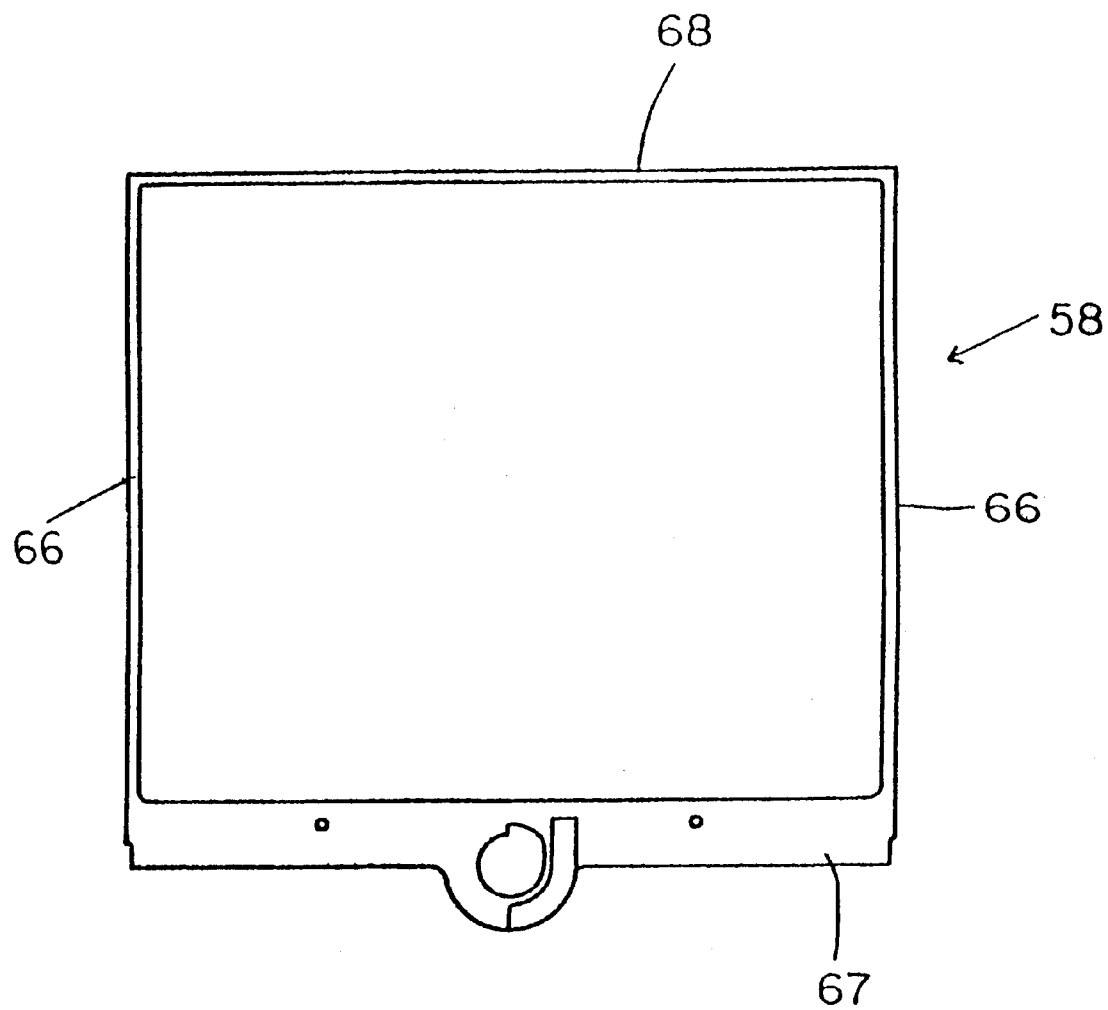
FIG. 8 is a top plan view of an alternate embodiment of the metal frame for the base housing.

The base housing 51 shown in FIGS. 3–5 is a rectangularly shaped planar plate of insulating plastic or resin material 59 having a U-shaped metal frame (see FIGS. 6 and 7) embedded therein as its reinforcement. The U-shaped metal frame 58 is a single piece stamped and formed from sheet metal so that it has opposite legs 66 and a cam plate 67 integrally connecting these opposite legs 66. The molded plate of insulating resin material 59 covering the U-shaped frame has terminal receiving cavities 60 arranged in the same lattice pattern or array, as shown in FIG. 5, as the array of pins 118 of PGA package 117. FIG. 8 shows a second embodiment of a metal frame in which opposite legs 66 are connected to each other by lower cam plate 67 and an inter-connection beam 68 at the opposite ends of legs 66.

Figure 9:
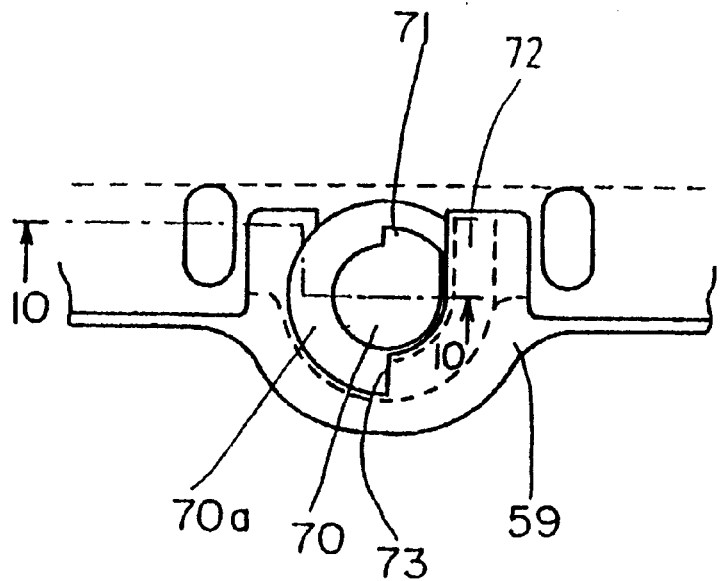
FIG. 9 is an enlarged fragmented view of a portion of the base housing.

In both embodiments, the lower cam plate 67 has an axle bearing hole 70 therein for rotatably accommodating the rotary axle 69 (FIGS. 30–33) of the eccentric cam member 53. The axle bearing hole 70 is elliptical rather than being perfectly circular, and has a notch 71 (FIGS. 9 and 10) on its circumference. It also has a J-shaped reinforcement 72 formed along part of its circumference, starting from the point diametrically opposite to the notch and extending around hole 70 almost to the notch 71.

After molding, the metal frame 58 is embedded in a generally planar sheet of insulating resin material or plastic 59, but the annular area 70a surrounding the axle bearing hole 70 of the lower cam plate 67 is exposed from the molded plastic. More specifically, referring to FIGS. 9 and 10, the upper surface of the lower cam plate 67 is exposed at the annular area 70a of the axle bearing hole 70 except for J-shaped reinforcement 72, which is embedded in the insulating plastic material 59. As a result, there is a stepwise discontinuity or riser formed between the exposed and unexposed portion of annular area 70a that acts as a retainer surface 73.

Figure 10:
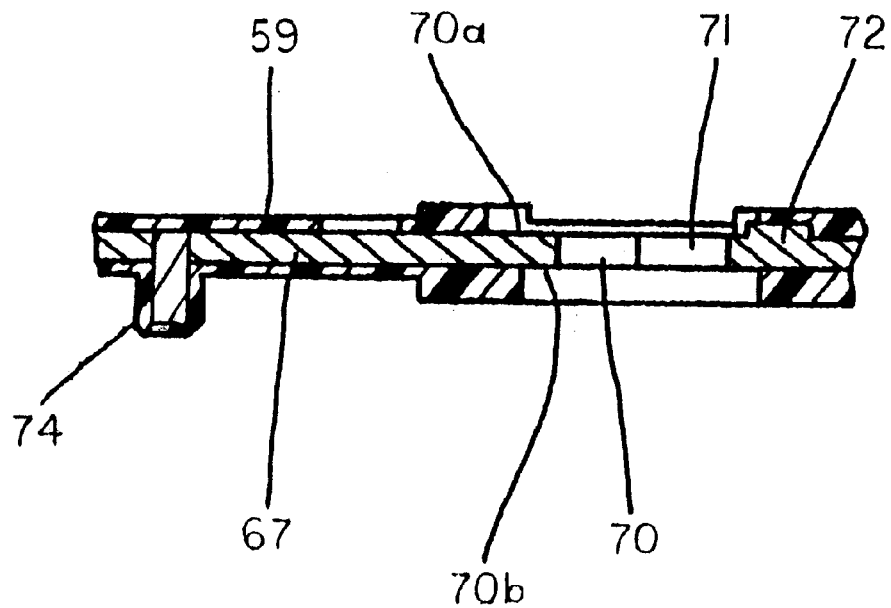
FIG. 10 is a sectional view of the fragment of the base housing of FIG. 9 taken generally along line 10—10 in FIG. 9.

The lower surface of the lower cam plate 67 has an annular circumferential area 70b exposed around the axle bearing aperture 70 (see FIGS. 5 and 10). The lower surface of the base housing 51 has positioning bosses or standoffs 74 molded thereon, and catch holes 76 formed at the corners thereof for receiving metal fitting or solder nails 75 therein.

Figure 11:
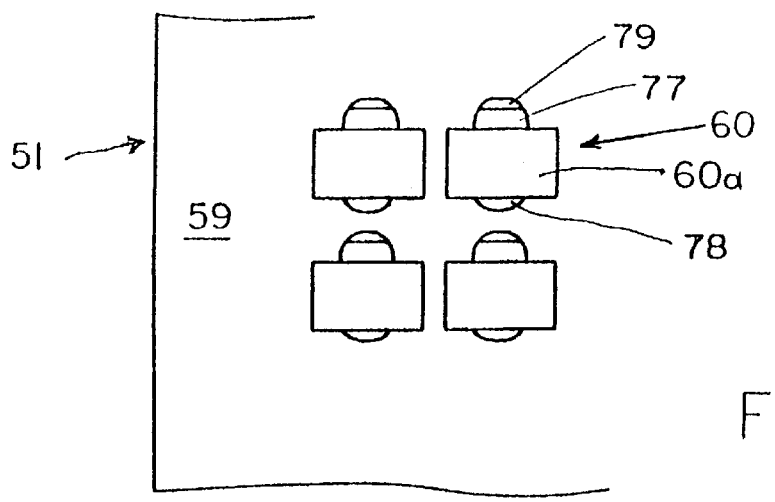
FIG. 11 is a fragmented, enlarged top plan view of a portion of the base housing, showing terminal-receiving cavities.
Figure 12:
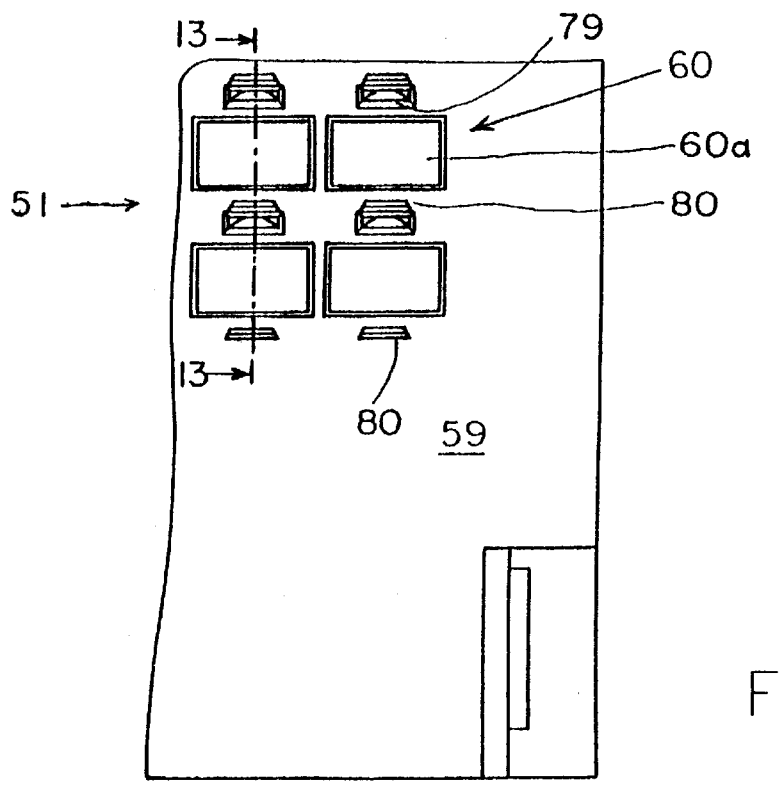
FIG. 12 is a fragmented, enlarged bottom plan view of a portion of the base housing showing a different view of the terminal receiving cavities.
Figure 13:
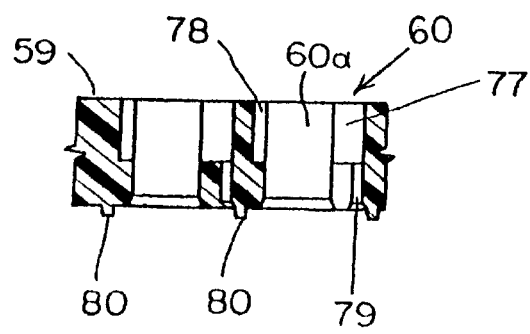
FIG. 13 is a sectional view of the fragment of the base housing of FIG. 12 taken generally along line 13—13 in FIG. 12.

The molded plate of insulating plastic material 59 extending between the opposite legs 66 of the metal frame 58 has terminal-receiving holes or cavities 60 arranged in a grid as seen from FIGS. 2, 3 and 5. As shown in greater detail in FIGS. 11 to 13, the terminal-receiving cavities 60 are generally rectangular in shape, with a rectangular portion 60a extending through the total thickness of the molded plate 59. Also, the terminal receiving cavities 60 have semicircular portions 77 and 78 on opposite sides thereof and extending down from the top surface of molded plate 59 about one half of the thickness thereof, while communicating with rectangular portion 60a of the terminal cavity 60. Semicircular portion 77 is an insertion section that allows a selected lead pin 118 of a pin grid-array package 117 to be inserted without contacting a terminal 57 located in terminal-receiving cavity 60. Thus, substantially no insertion force is required. Terminal retention slots 79 extend down from the bottom of insertion section 77 to the bottom of the base housing 51. The base housing 51 has projections 80 extending from the bottom surface thereof as will be described in further detail below.

Figure 14:
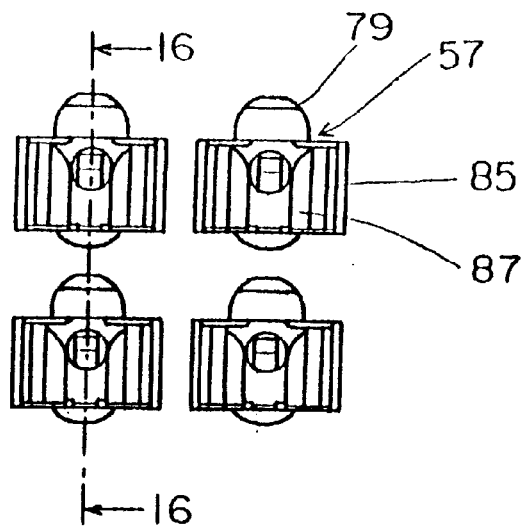
FIG. 14 is an enlarged top plan view, illustrating four terminals press-fit within their terminal-receiving cavities.
Figure 15:
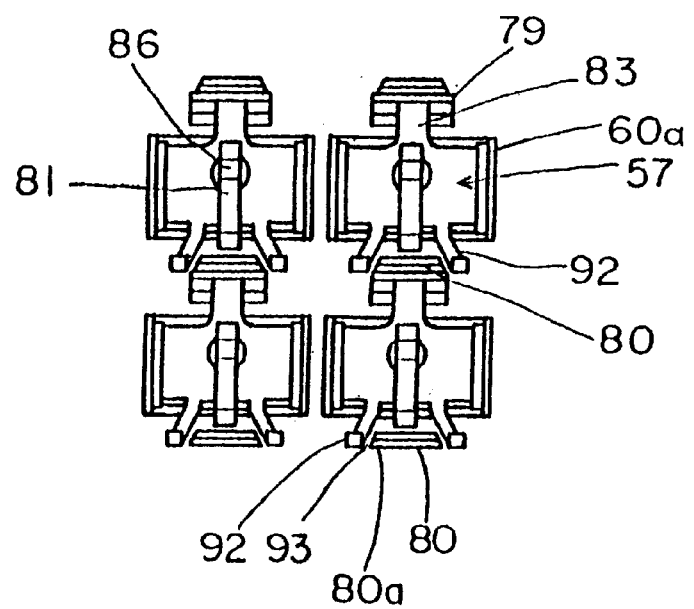
FIG. 15 is an enlarged bottom plan view of the four terminals of FIG. 14 within their terminal-receiving cavities.
Figure 16:
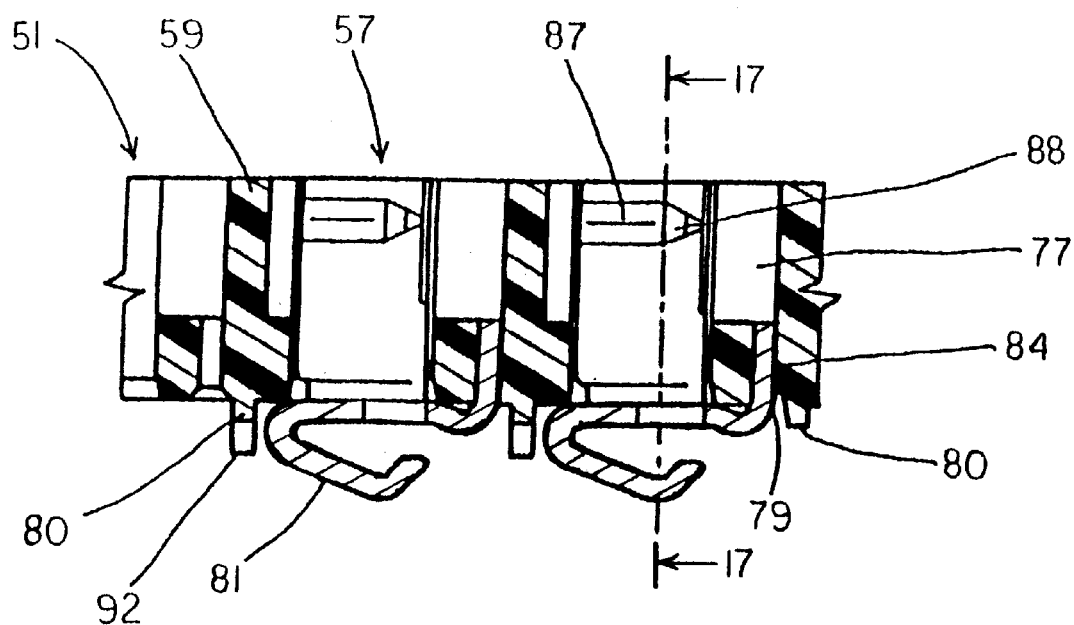
FIG. 16 is a sectional view taken generally along line 16—16 of FIG. 14.
Figure 17:
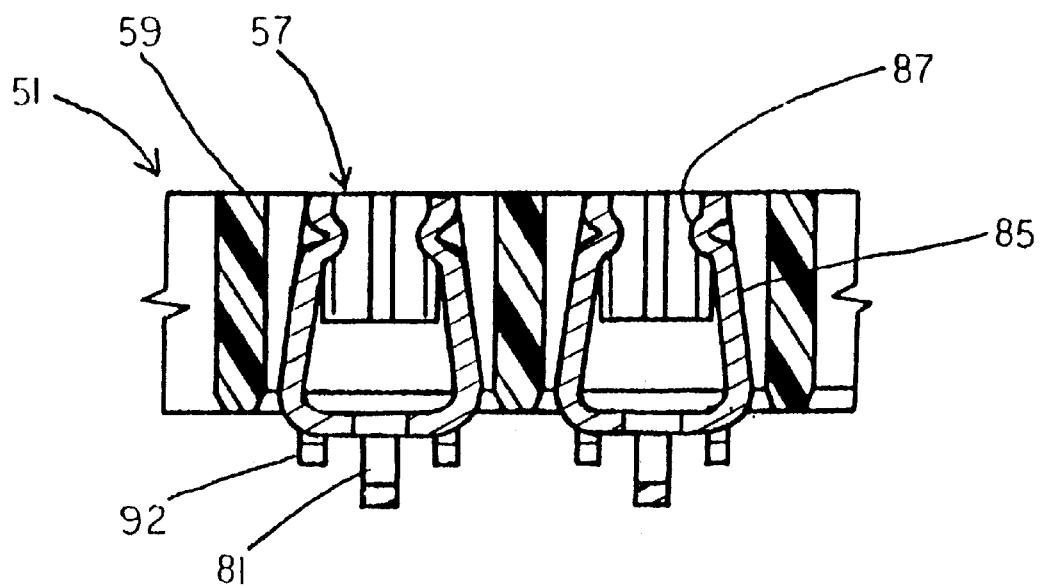
FIG. 17 is a sectional view taken generally along line 17—17 of FIG. 16.
Figure 18:
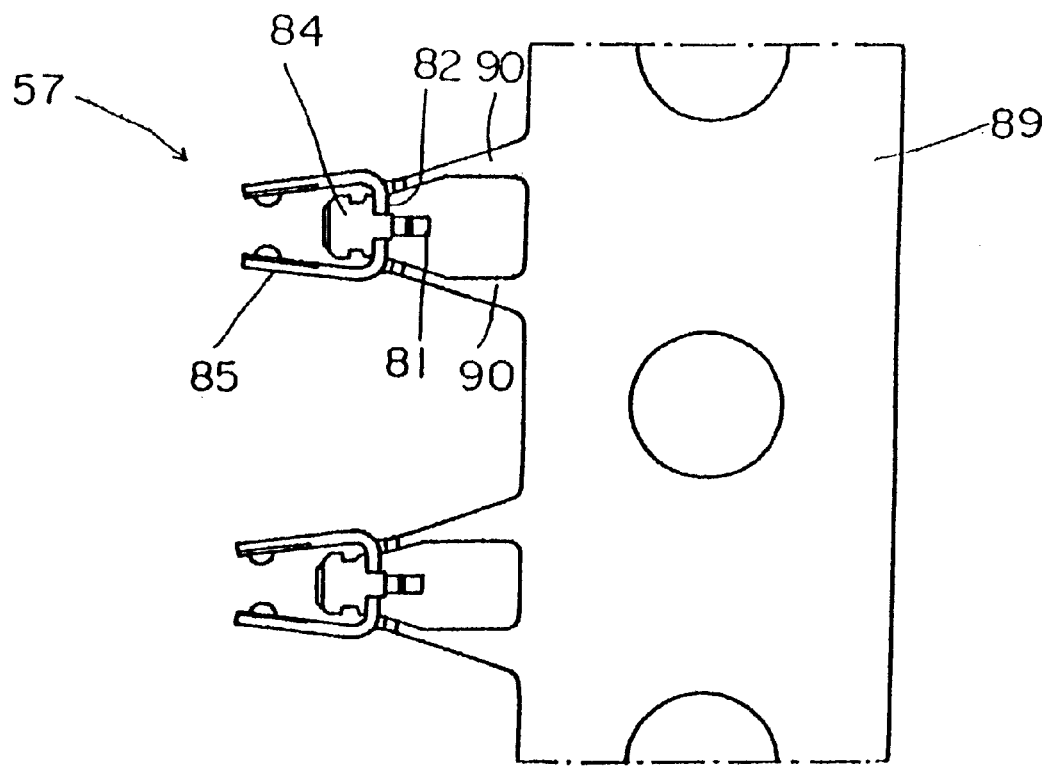
FIG. 18 is a front elevational view of stamped terminals of the present invention connected to a carrier strip.

A conductive terminal 57 is mounted within each terminal-receiving cavity 60 by inserting it from the bottom of the base housing 51 as best seen in FIGS. 16 and 17. As also shown in FIGS. 14, 15 and 48, each terminal 57 is stamped and formed of sheet metal material and includes a generally U-shaped section formed of a base 82 and a pair of contact arms 85 integrally connected to and extending up from the base 82. The contact arms 85 are angled toward each other so that they are spaced further apart adjacent base 82 than at their distal free end. At the distal end of each contact arm is an inwardly bulged contact area or section 87 which is formed to create a high pressure contact area which engages a pin 118 of a PGA package 117. The contact area 87 tapers away from the terminal retention section 84 as indicated at 88 in FIG. 16 in order to create a lead-in to receive the pin 118 of a PGA package 117.

Each terminal also includes a solder tail 81 that extends from one lateral side of base 82. The solder tail extends initially away from base 82 and then curves downward until it angles downward relative to the lower surface of the base housing 51 in a generally linear manner to provide an appropriate tail for surface mount soldering on the surface of a printed circuit board. An end portion of the solder tail may extend upwards a short distance in order to form a generally circular surface mount contact section 86. Upon mounting the socket 50 on a printed circuit board, the contact section 86 may be surface mount soldered to conductive pads on the printed circuit board in a known manner.

The terminals also include a terminal retention section for engaging a respective terminal retention slot 79 in the base housing 51 in order to secure the terminal within the housing. The terminal retention section 84 extends generally upward from the base 82 generally in parallel with the contact arms 85 of the terminal. An arcuate stress-dispersion arm 83 is located between the base 82 and the terminal retention section 84.

Each of the contact arms 85 is approximately as tall as the thickness of the base housing assembly and the terminal retention section 84 is as tall as approximately one-half the thickness of the base housing. As a result, the terminal retention section 84 does not enter the pin-receiving cavity within the base mold.

Figure 19:
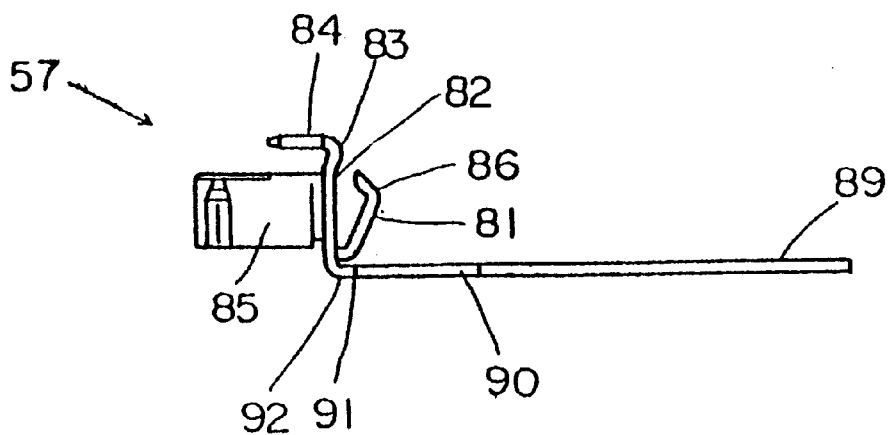
FIG. 19 is a side elevational view of the stamped terminals of FIG. 18 connected to the carrier strip.
Figure 20:
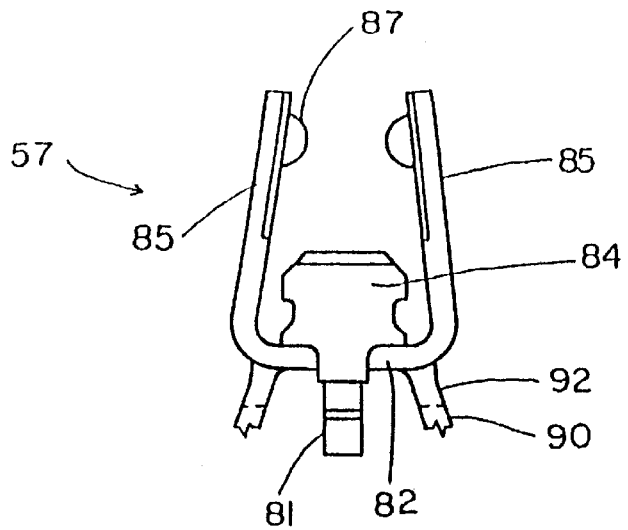
FIG. 20 is an enlarged front elevational view of one terminal of FIG. 18.
Figure 21:
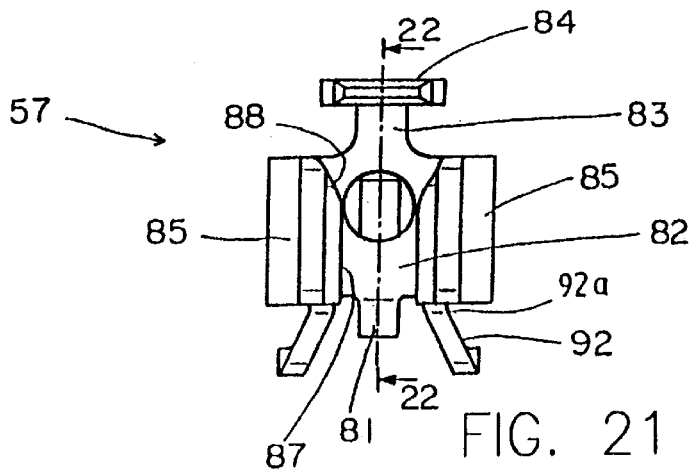
FIG. 21 is an enlarged bottom plan view of the terminal of FIG. 20.
Figure 22:
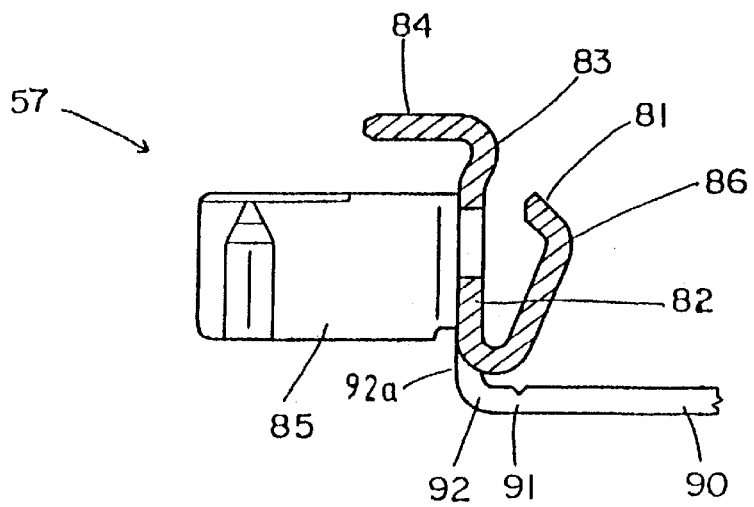
FIG. 22 is an enlarged sectional view of the terminal of FIG. 21 taken generally along line 22—22 in FIG. 21.
Figure 23:
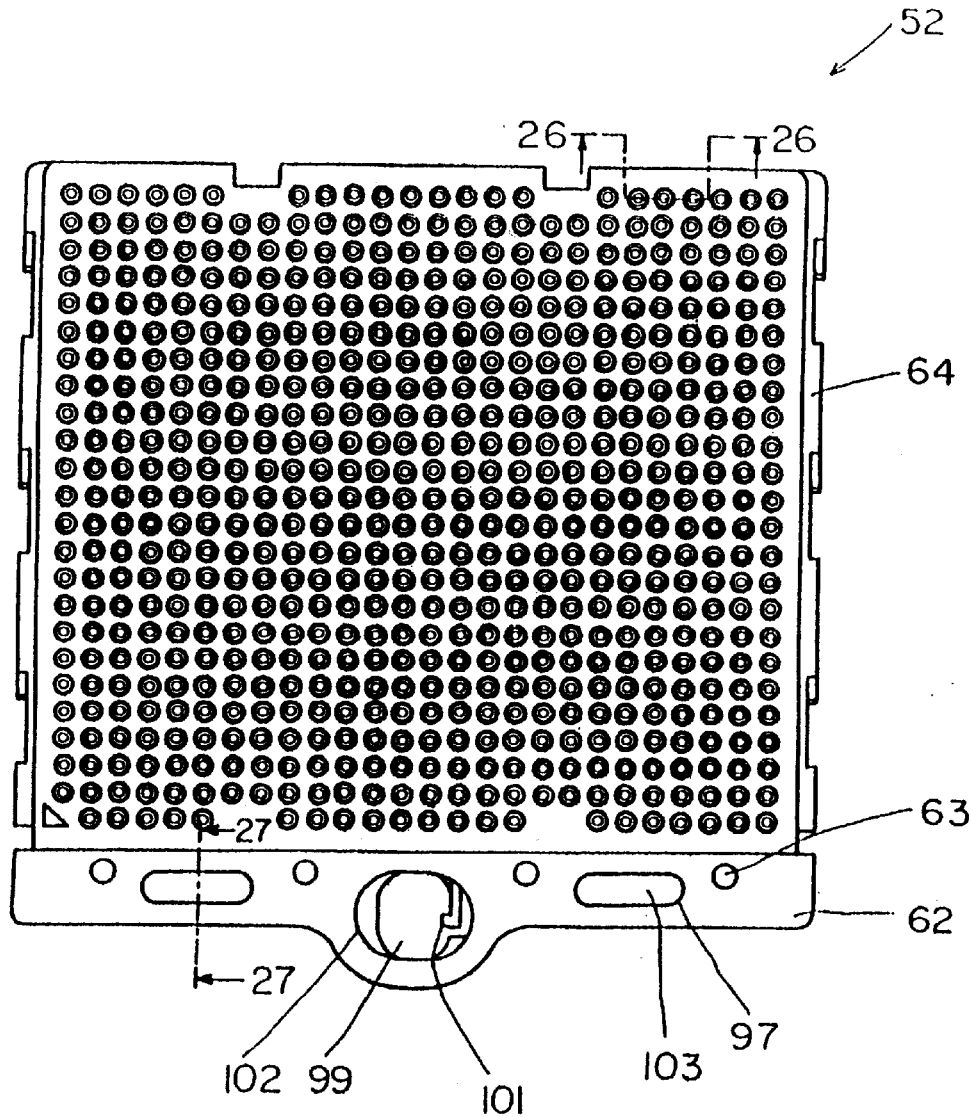
FIG. 23 is a top plan view of the cover of the present invention.
Figure 24:
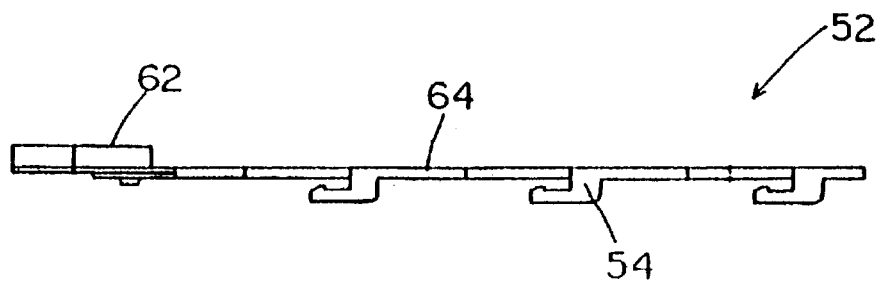
FIG. 24 is a side elevational view of the cover of FIG. 23.
Figure 25:
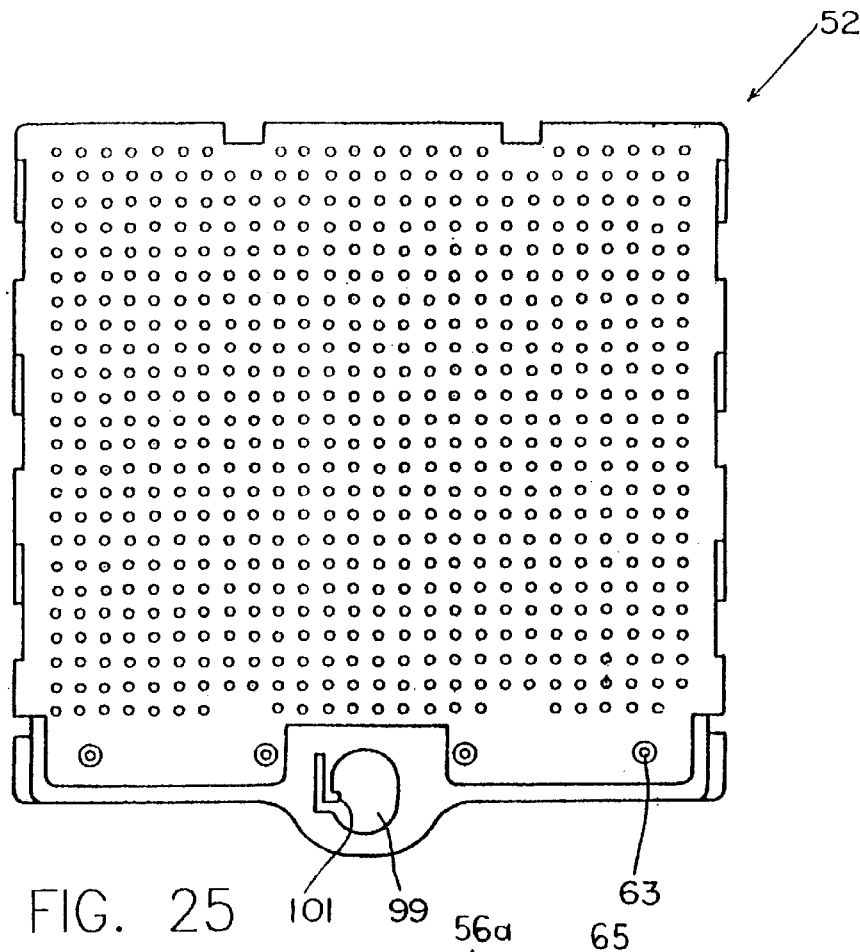
FIG. 25 is a bottom plan view of the cover.

During the manufacturing process, all of the terminals are secured to a carrier strip 89 by a pair of joints 90 so that the terminals are consistently positioned in a parallel arrangement. As such, the terminals can be separated from the carrier strip 89 by cutting the joints 90 at weakened portions 91 (see FIGS. 19 and 22). A divergent projection 92 remains projecting from each terminal after the joints 90 are cut at their weakened portions 91. These divergent projections 92 are located adjacent to projections 80 on the bottom of the base housing 51 (FIG. 15). In fact, the pair of divergent projections 92 extend around the projections 80 of the base housing so that there is a small gap 93 between the side walls 80 of the divergent projections 92 and the projection 80.

Figure 26:
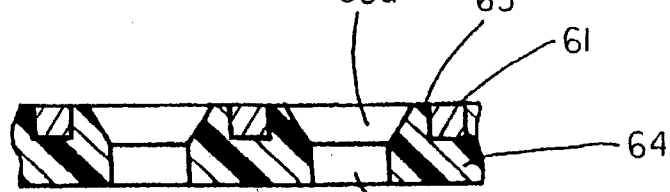
FIG. 26 is an enlarged fragmented sectional view taken generally along the line 26—26 in FIG. 23.
Figure 27:
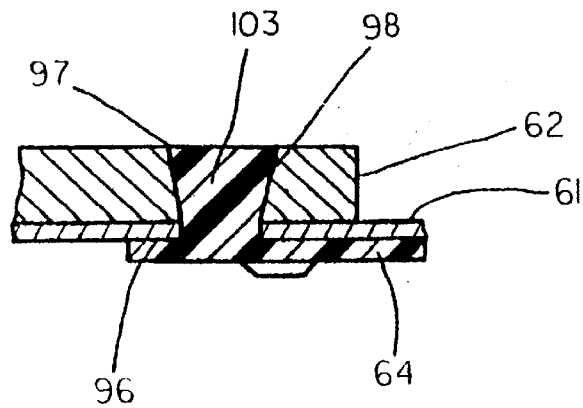
FIG. 27 is an enlarged fragmented sectional view taken generally along the line 27—27 in FIG. 23.
Figure 28:
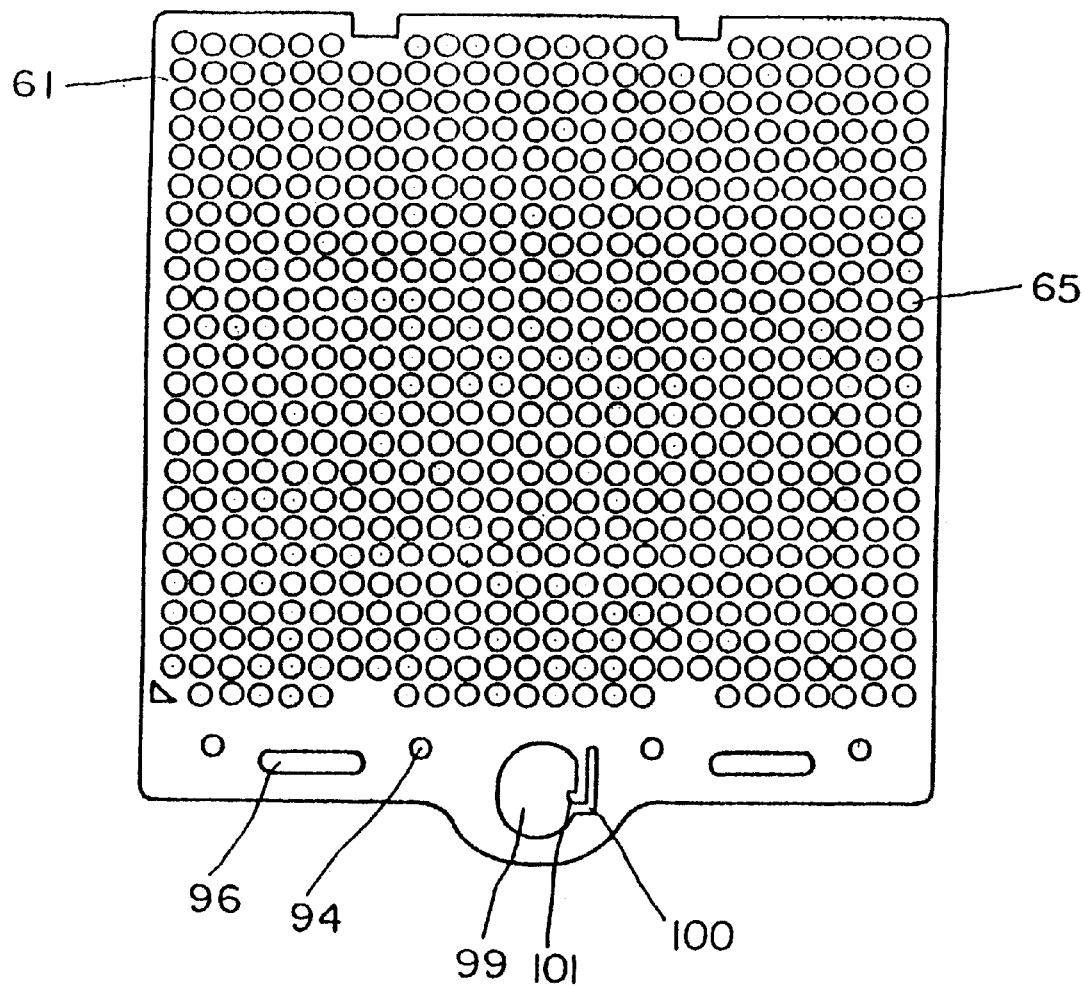
FIG. 28 is a top plan view of the metal stiffener of the cover of FIG. 23.
Figure 29:
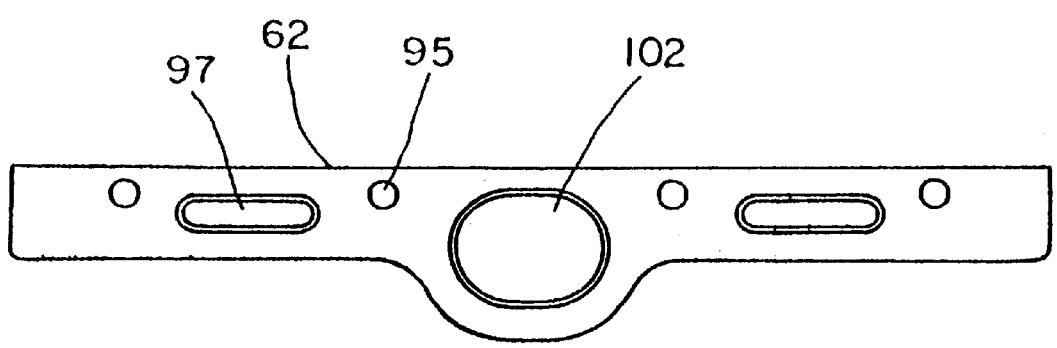
FIG. 29 is a top plan view of the upper cam plate section of the cover of FIG. 23.
Figure 30:
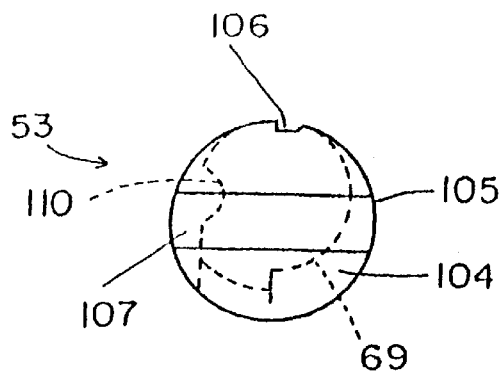
FIG. 30 is a top plan view of the eccentric cam member shown in FIG. 2.
Figure 31:
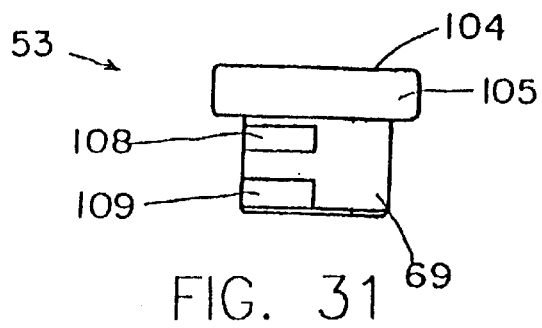
FIG. 31 is a front elevational view of the eccentric cam member of FIG. 30.

FIGS. 23 to 27 illustrate the structure of the molded cover while FIG. 28 shows a metal stiffener 61 and FIG. 29 shows an upper cam plate 62 which are both components of the cover.

Referring to FIG. 28, metal stiffener 61 is formed from sheet metal and has a plurality of apertures arranged in a lattice pattern. A longitudinally elongated hole 99 is formed at the center of one lateral side of stiffener 61. The longitudinally elongated hole 99 has an L-shaped slit 100 extending therefrom, which defines a deflectable leg 101 with a locking-finger 101a projecting into the aperture. The upper cam plate 62 has a laterally (relative to the socket 50) elongated hole 102 formed adjacent its center and generally aligned with elongated hole 99 of stiffener 61. The length of the longer axis of the longitudinally elongated hole 99 of stiffener 61 is substantially equal to the length of the shorter axis of the laterally elongated hole 102, as best seen from FIG. 23. The sides of laterally elongated hole 102 accommodate snugly the eccentric cam 104 of the eccentric cam member 53 to function as a cam follower whereas the sides of longitudinally elongated hole 99 accommodate snugly the rotary axle 69 of the eccentric cam member 53 to function as a second cam follower. Prior to the plastic of cover 52 being molded, the stiffener 61 and upper cam plate 62 may be secured together in a spaced apart relationship by inserting metal pins 63 into holes 94 and 95 of the stiffener 61 and cam plate 62, respectively. Through such a configuration, elongated slots or through holes 96 in stiffener 61 are aligned with slots or through holes 97 in cam plate 62. As best seen in FIG. 27, slots 97 are upwardly divergent or tapered so that they are wider at their upper surface than their lower surface. Upon positioning the stiffener 61 and cam plate 62 relative to each other and placing them in a mold, insulating plastic or resin material is injected into the mold, resulting in the cover shown in FIGS. 23–27. Portions of the metal stiffener 61 and upper cam plate 62 are embedded in molded plate 64 to form cover 52 with the upper surface of the metal stiffener 61 exposed, as best seen in FIGS. 26 and 27. The exposed upper surface of the metal stiffener 61 is preferably coated beforehand with an insulating material. During the molding process, the insulating resin material flows into the elongated holes 96 of the metal stiffener 61 and the elongated holes 97 of the overlying upper cam plate 62 to positively fasten these plates together as indicated at 103 in FIG. 27. As a result of the upwardly divergent slots 97 in upper cam plate 62, the molded portion 64 of cover 52 is also upwardly divergent at 103 which acts to secure the stiffener 61 and the molded plate 64 together to create cover 52.

The cover 52 also includes a plurality of through holes 56 formed in the molded plate 64 in registration with the apertures 65 of the metal stiffener 61. As seen in FIG. 26, each through hole 56 includes a first section with straight sidewalls and a second section 56a which is upwardly divergent in shape. The divergent opening 56a facilitates the guiding of the lead pin 118 of a PGA package 117 into socket 50.

Figure 32:
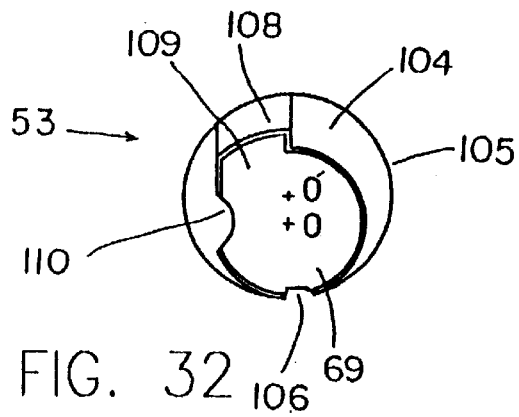
FIG. 32 is a bottom plan view of the eccentric cam member of FIG. 30.
Figure 33:
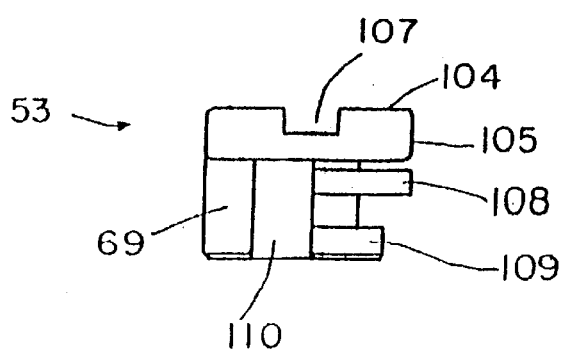
FIG. 33 is a left side elevational view of the eccentric cam member of FIG. 30.

FIGS. 30 to 33 show an eccentric cam member 53 for moving slidably the cover 52 on the underlying base housing 51. The center 0' of the eccentric cam 104 is spaced apart from the center 0 of the rotary axle 69 as best seen in FIG. 32. The eccentric cam member 53 has a vertical stop slot 106 at which the circumference of the eccentric cam 104 (or cam surface 105) and the circumference of the rotary axle 69 meet together. The eccentric cam 104 has a slot 107 on the top surface thereof for receiving a blade-like tool (not shown) such as a screwdriver.

The rotary axle 69 has relatively long and short spaced apart ridge projections or orientation structure 108 and 109 formed thereon, respectively, projecting outward on the side diametrically opposite to the vertical engagement slot 106 or metal component stop member. The eccentric cam member 53 has a vertical insertion slot 110 adjacent to these ridge projections 108 and 109. The eccentric cam member 53 is positioned in the space defined by the laterally elongated hole 102 in cam plate 62 and longitudinally elongated hole 99 of the cover 52 as well as the axle bearing aperture 70 of the base housing 51. The height of the eccentric cam member 53 is generally equal to the combined thickness of base housing 51 and cover 52 at the location of cam member 53.

Before describing the relationship between the eccentric cam member 53 and the base housing and cover assembly, the engagement pieces 54 depending from the opposite longitudinal sides of the overlying cover 52 and the engagement projections 114 of the underlying base housing 51 are described below. FIGS. 1, 2, 24 and 34 to 36 show L-shaped engagement pieces 54 depending from the opposite longitudinal sides of the cover 52. Three L-shaped engagement pieces 54 and generally evenly spaced along each longitudinal side of cover 52. Each L-shaped engagement piece 54 has a horizontal extension 111 (FIGS. 34–36) that extends generally parallel to the overlying cover and terminates with a projection 112, which has a forwardly descending slope 113 formed thereon.

The base housing 51 has complementary engagement projections 114 formed on the opposite longitudinal sides of the base housing and spaced apart so as to be engaged by engagement pieces 54 of cover 52. Each engagement projection 114 includes a cantilever-like extension extending generally parallel to the base housing 51, and terminates with a lower projection 115, which engages the upper projection 112 of the horizontal extension 111 of the L-shaped engagement piece 54 to retain the cover on base housing 51.

Figure 34:
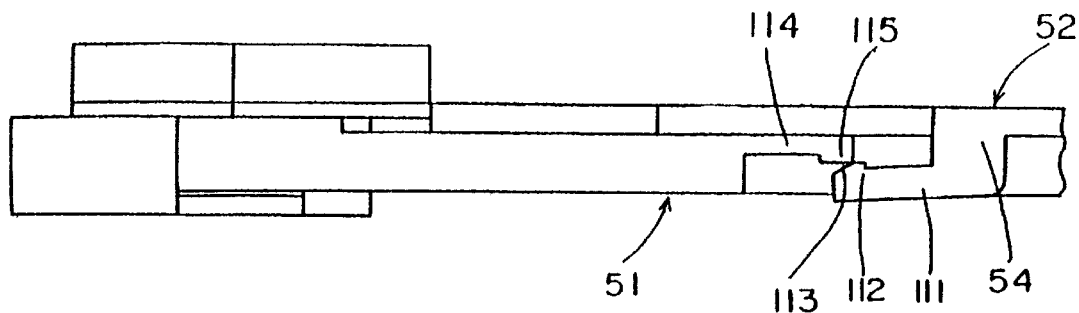
FIG. 34 is a fragmented side elevational view of the base housing and cover illustrating an initial position of the cover while positioned on the base housing to permit the eccentric cam member to be press-fit into the cover and base housing.
Figure 37:
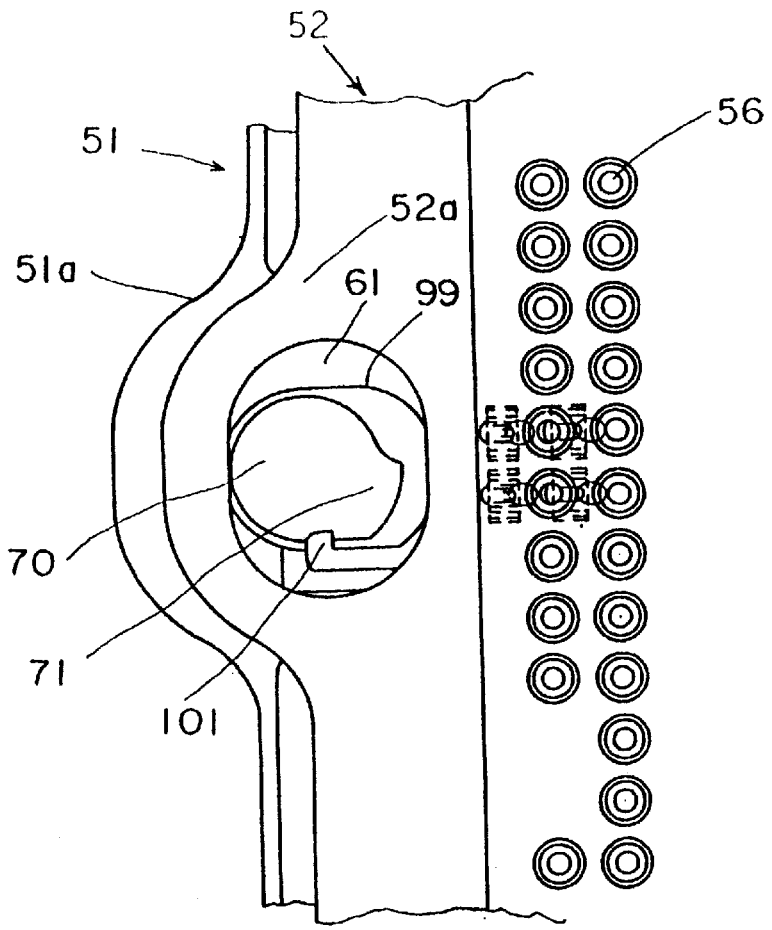
FIG. 37 is a top plan view of a selected fragment of the socket prior to insertion of the eccentric cam member into the cover and base housing.
Figure 38:
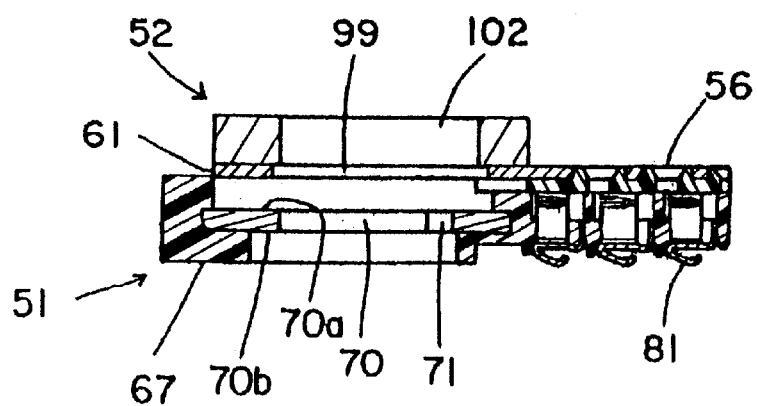
FIG. 38 is a sectional view of the selected fragment of the socket shown in FIG. 37.

When assembling the base housing 51 and the cover 52 together, these components are laid on each other so that their engagement pieces 54 and 114 confront each other as shown in FIG. 34. At such position, the semicircular extensions 51a and 52a of the base housing 51 and cover 52 are positioned relative to each other as shown in FIGS. 37 and 38, permitting the axle bearing hole 70 of the lower cam plate 67 to be seen through the longitudinally elongated hole 99 of the metal stiffener 61 of cover 52.

In this position, the eccentric cam member 53 is fitted in the socket assembly by inserting the rotary axle 69 of the cam member 53 in the axle bearing hole 70 of the base housing 51 after passing through holes 99 and 102 of the cover 52. The eccentric cam member 53 is oriented so that the long and short ridge projections 108 and 109 (FIGS. 31–33) are aligned with the notched portion or complementary orientation structure 71 (FIG. 37) of the axle bearing hole 70 thereby avoiding the interference between the rotary axle 69 and the circumference of the axle bearing hole 70. When the eccentric cam member 53 is oriented as such, the vertical insertion slot 110 of the rotary axle 70 is aligned with finger or actuator stop member 101a of deflectable leg 101 which projects into the longitudinally elongated hole 99 of the metal stiffener 61. The slot 110 is dimensioned so as to be large enough to avoid interference with finger 101a during this assembly step.

Figure 39:
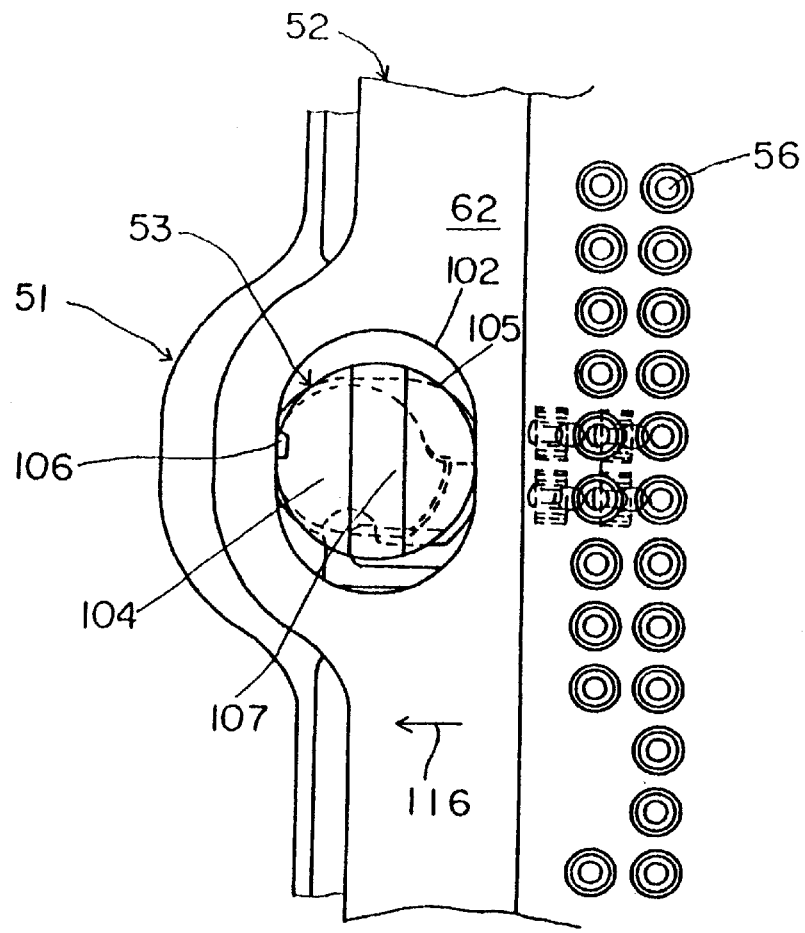
FIG. 39 is a top plan view of the fragment of the socket of FIG. 37 with the eccentric cam member inserted into the cover and base housing.
Figure 40:
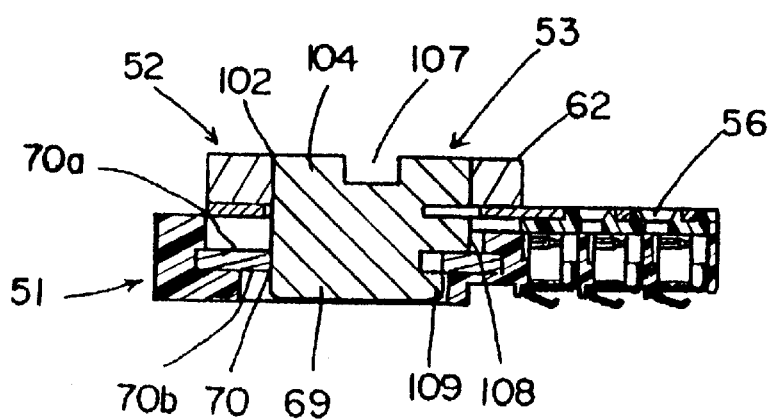
FIG. 40 is a sectional view of the selected fragment of the socket of FIG. 39
Figure 41:
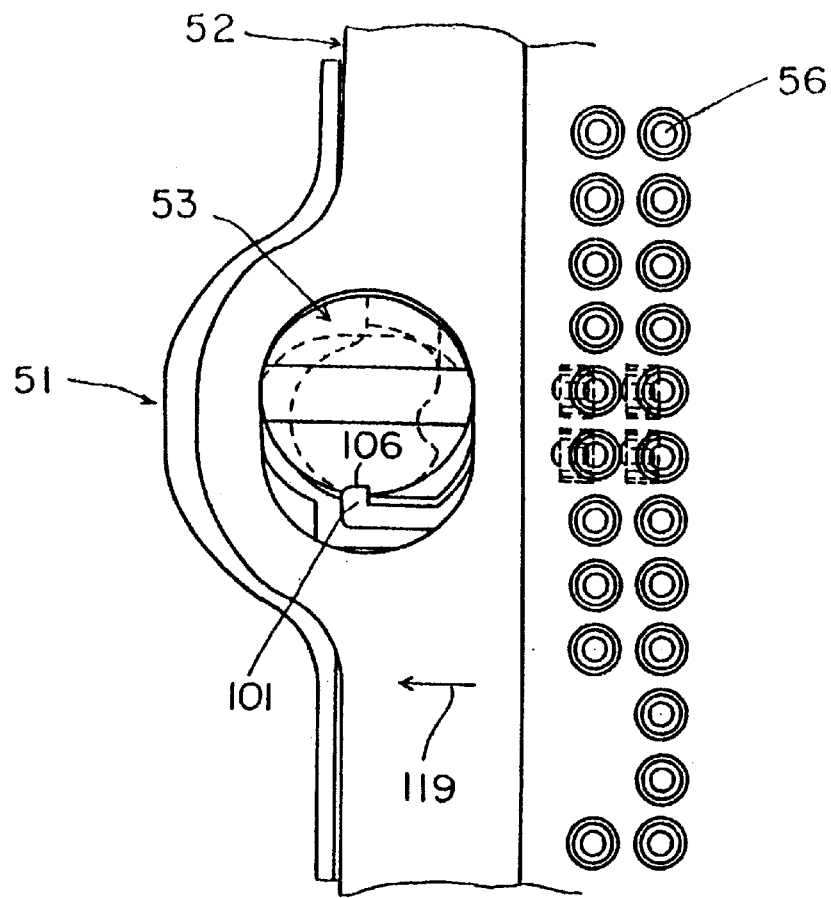
FIG. 41 is a top plan view of the selected fragment of the socket of FIG. 39 with the cover in the zero insertion force pin-insertion position.
Figure 42:
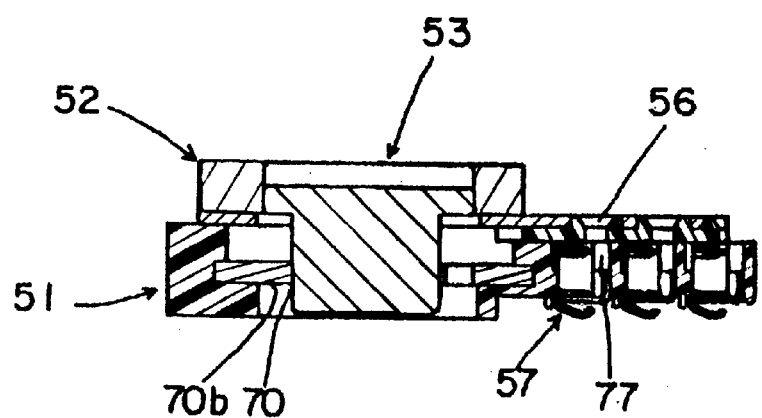
FIG. 42 is a sectional view of the selected fragment of the socket of FIG. 41.

FIGS. 39 and 40 show that the eccentric cam member 53 having been inserted into the socket assembly, passing through the openings in cover 52 and the underlying base housing 51. The long ridge projection 108 rides on the upper surface of annular area 70a adjacent axle bearing hole 70, thereby permitting rotation of the long ridge projection 108 therealong whereas short ridge projection 109 is positioned beneath the lower surface 70b of annular area 70b adjacent axle bearing hole 70, thereby permitting rotation of the short ridge projection 109 therealong (see FIG. 40). In other words, annular area 70a is sandwiched between long and short ridge projections 108 and 109.

The eccentric cam 104 of the eccentric cam member 53 is located in laterally elongated hole or aperture 102 of upper cam plate 62 of cover 52 with its cam surface 105 confronting the inner circumference of elongated hole 102. The upper surface of the eccentric cam is generally flush with the upper surface of the upper cam plate 62, and the lower surface of the rotary axle 69 is generally flush with the lower surface of the base housing 51. Counterclockwise rotation of the eccentric cam member 53 over 90 degrees completes the assembling of cam member 53 into socket 50.

Rotation of the eccentric cam member 53 may be effected by fitting a screwdriver in slot 107 and by rotating the tool. As rotary axle 69 rotates in the axle bearing hole 70, the eccentric cam member 104 engages the cam surface of elogated hole 102, which causes cover 52 to slide linearly relative to base housing 51 in the direction indicated by arrow 116 in FIG. 39. Rotating the cam member 53 over 90 degrees aligns finger 101a with vertical engagement slot 106 to stop the rotation of the eccentric cam member 53, and hence the cover 52, at a predetermined position.

Figure 35:
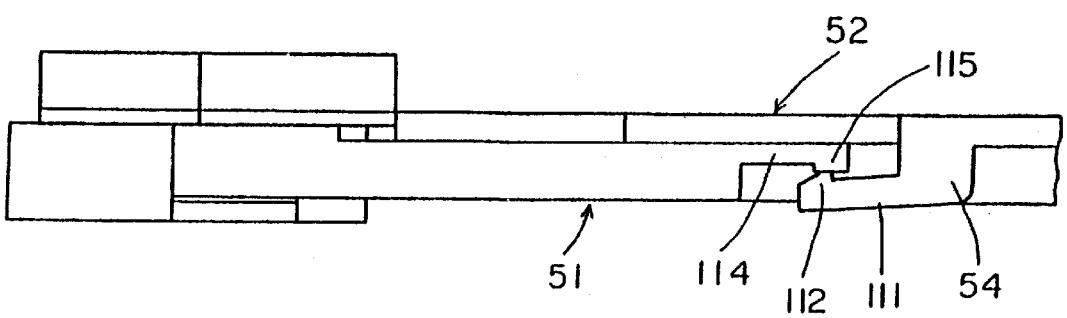
FIG. 35 is a fragmented side elevational view similar to FIG. 34, illustrating the cover in a zero insertion force pin-insertion position.
Figure 36:
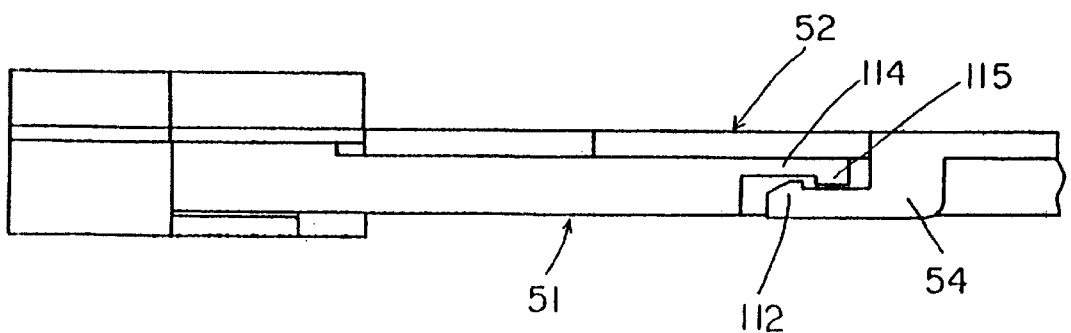
FIG. 36 is a fragmented side elevational view similar to FIG. 34, illustrating the cover in a contact engagement position.

FIGS. 35, 41, 42 and 45 show that the eccentric cam member 53 in its locked/pin insertion position in which finger 101a engages vertical engagement slot 106. As seen in FIG. 35, the horizontal extension 111 of each engagement piece 54 of the cover 52 had slid under cantilever-like engagement piece 114 of the base housing 51 until the lower projection 115 of the cantilever-like engagement piece 114 rides on the slope 113 of the upward projection 112 of the horizontal extension 111. Thus, the engagement piece 54 is yieldingly bent downward, and the cover 52 is pushed tightly against the base housing 51.

Figure 44:
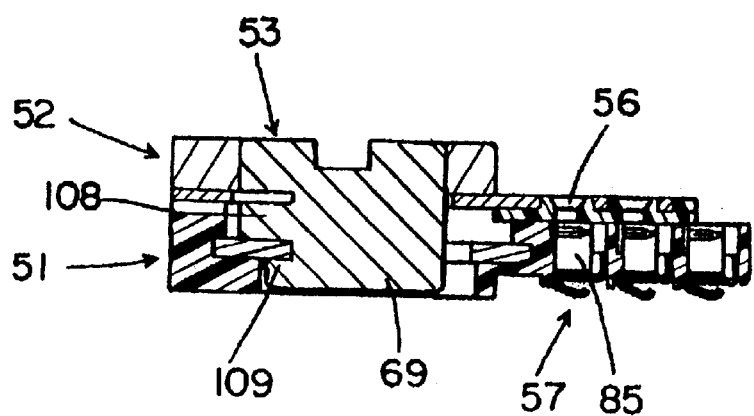
FIG. 44 is a sectional view of the selected fragment of the socket of FIG. 43.

Referring to FIG. 44, the short ridge projection 109 rotates the lower surface 70b adjacent axle bearing hole 70 to reach the notch-free circumference of the axle bearing hole 70, thus permitting the short ridge projection 109 to engage the lower cam plate 67 of metal frame 58. Thus, the eccentric cam member 53 is prevented from rising by the short ridge projection 109, which engages the lower cam plate 67. This also contributes to the positive fastening of the cover 52 to the base housing 51.

Figure 45:
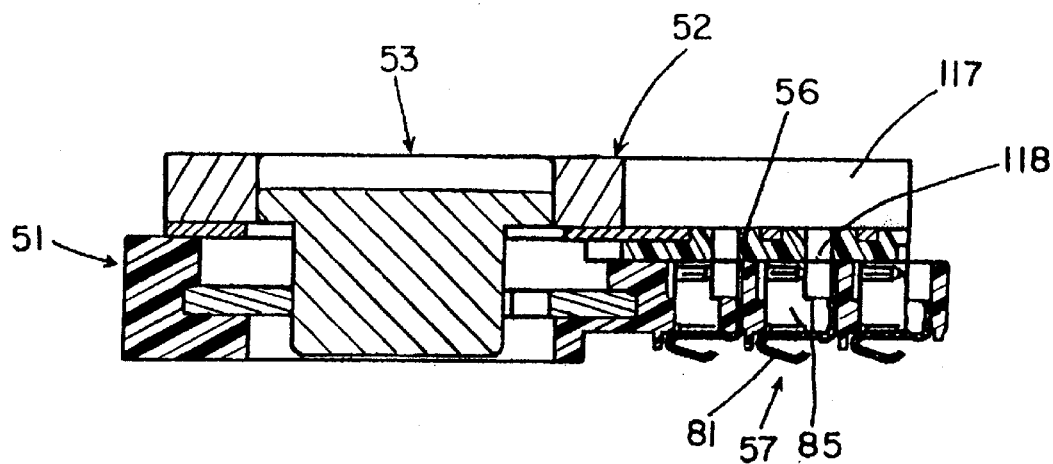
FIG. 45 is an enlarged longitudinal section of the socket as shown in FIG. 42 with a PGA package mounted therein.

In the locked/pin insertion position in which the finger 101a engages vertical engagement slot 106, each through hole 56 of the cover 52 is aligned with a selected pin insertion cavity 77, which is adjacent to the opposed contact arms 85 of the terminals 57 in the terminal-receiving cavities 60. In such configuration, each lead pin 118 of a pin grid-array package 117 can be inserted into socket 50 with essentially no insertion force being applied to the lead pins 118. FIG. 45 shows a pin grid-array package 117 located on the cover 52 with the lead pins 118 inserted in the pin insertion cavities 77 without any insertion force having been applied.

After insertion of the lead pins 118, the eccentric cam member 53 is rotated counterclockwise another 90 degrees. This additional 90 degrees of rotation causes the cover 52 and the PGA package 117 mounted thereon to slide (to the left in FIG. 46) to the contact engaging position shown in FIGS. 36, 43, 44 and 46 so that the pins 118 of the PGA package 117 engage respective ones of terminals 57. The rotation is stopped when the long ridge projection 108 of the rotary axle 69 abuts the retainer surface 73 adjacent the circumference of axle bearing aperture 70 which thus stops the linear motion of cover 52 relative to base housing 51.

In the assembled socket 50, the eccentric cam member 53 can rotate from the forceless-insertion position (FIGS. 35, 41, 42 and 45) in which finger 101a of metal stiffener 61 of cover 52 engages vertical engagement slot 106 of the eccentric cam member 53 to the operational/contact engaging position (FIGS. 36, 43, 44 and 46) in which the long ridge projection 108 of the rotary axle 69 abuts retainer surface 73 formed on the circumference of the axle bearing aperture 70 and the pins 118 of the PGA package 117 engage terminals 57. The angular range between these positions is 90 degrees.

Figure 43:
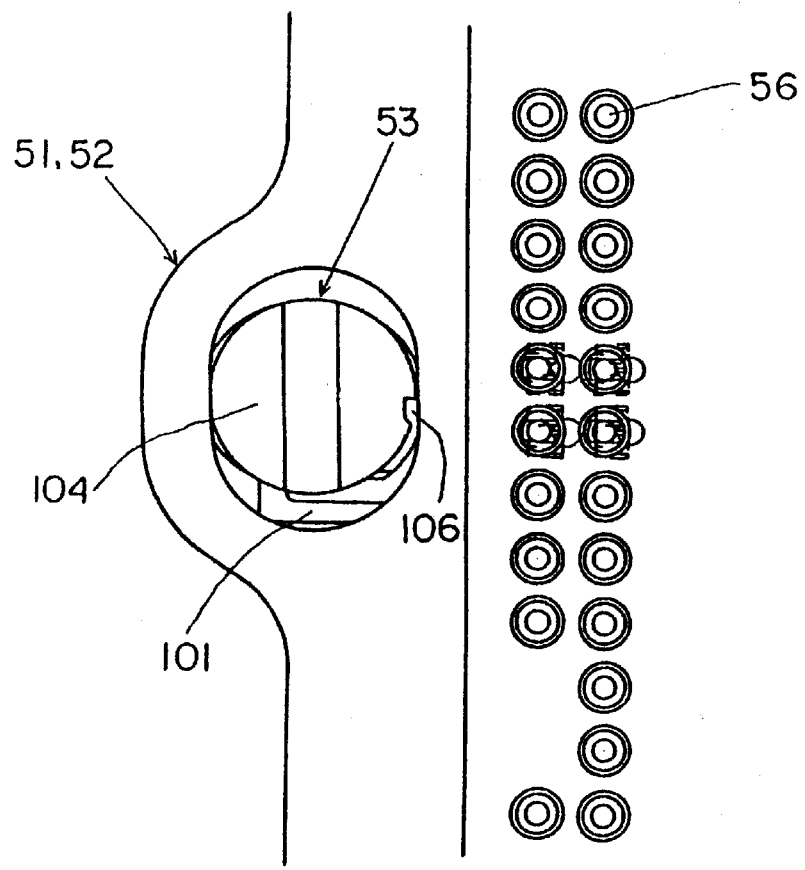
FIG. 43 is a top plan view of the selected fragment of the socket with the cover in the contact engagement position.
Figure 46:
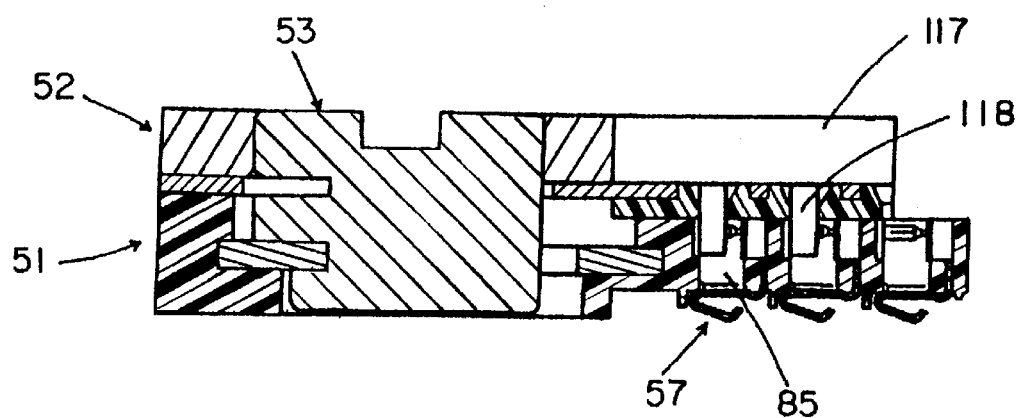
FIG. 46 is an enlarged longitudinal section of the socket as shown in FIG. 44 with a PGA package mounted therein.

As seen in FIGS. 43, 44 and 46, when the cover 52 is in its operational/contact engaging position, each and every through hole 56 of cover 52 is positioned immediately above the contact arms 85 of terminals 57 in the terminal-receiving cavities of the base housing 51. The sliding of the cover 52 bearing the pin grid-array package 117 from the insertion position shown in FIG. 45 to the contact engaging position shown in FIG. 46 brings the lead pins 118, which are inserted in the through holes 56 of the cover 52, between the contact arms 85 of a selected terminal 57, thus completing connection of the pin grid-array package 117 to the socket 50.

When each lead pin engages the opposed contact arms 85 of a selected terminal, it is forcedly driven into the space defined by the raised contact surfaces 87 of the opposite contact arms 85 while being guided smoothly into position by lead-in 88 which is divergent toward the pin insertion cavity 77. The space between raised contact surfaces 87 is dimensioned so that a lead pin therebetween is engaged with a contact pressure strong enough to assure that stable and reliable electric contact is established.

It is very difficult to exactly position in the socket 50 the contact arms 85 of all of the terminals 57 and to maintain exact registration with the grid-like arrangement of lead pins 118 in a pin grid-array package 117. Some lead pins 118 may apply undesired force, to the contact arms 85 of some terminals 57 as the cover 52 moves on the base housing 51, thus causing the contact pieces 85 to move laterally. To minimize the stress on the housing caused by any such movement, terminals 57 permit the stress to be released by adding additional flexibility through stress-dispersion arm 83 positioned between base 82 and retention section 84. As described earlier, the remaining divergent projections 92 of the terminal 57 are positioned on opposite sides of projections 80 close to the opposite sloped ends 80a. These remaining divergent projections 92 of the terminal 57 abut the opposite slopes 80a of the projection 80 in order to further distribute stresses.

Figure 47:
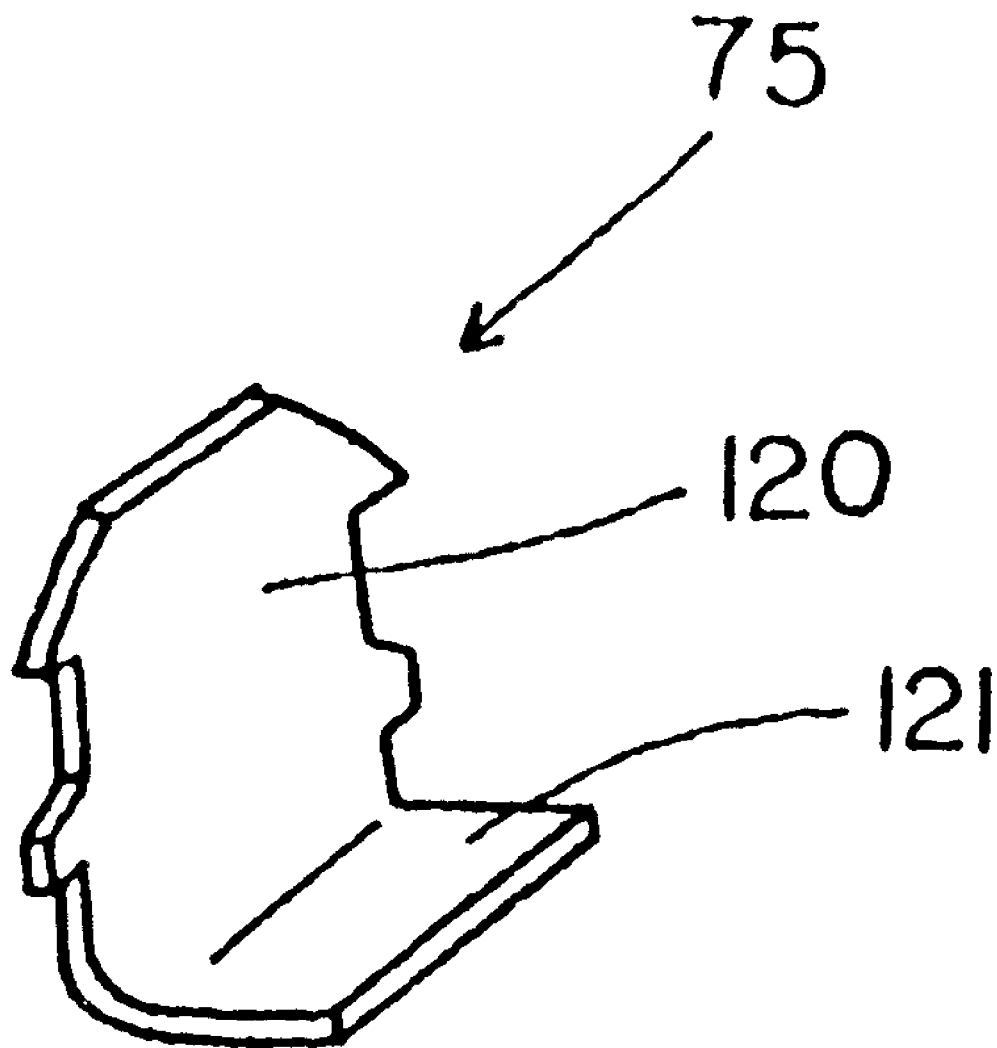
FIG. 47 is a perspective view of a metal nail to be attached to each of the four corners of the base housing.

FIG. 47 shows a metal fitting or solder nail 75 which may be positioned on the bottom of base housing 51 (FIG. 1). The upright leg 120 of the nail 75 is pushed into a slot 76 (FIG. 5) located at each corner of the base housing 51. The horizontal foot 121 of the nail 75 is soldered to a printed circuit board on which the socket 50 is mounted.

Although the present invention has been illustrated and described with respect to exemplary embodiment thereof, it should be understood by those skilled in the art that the various changes, omissions and additions may be made therein and thereto without departing from the spirit and scope of the present invention as set forth in the appended claims.

What is claimed is:

1. A zero insertion force electrical connector for mounting on a circuit member and receiving a device having a pin terminal array of conductive pin terminals, said electrical connector comprising:

a base housing, said base housing having an upper surface and a lower surface and a plurality of terminal-receiving cavities arranged in a terminal-receiving cavity array generally corresponding to the pin terminal array;

a cover mounted on said upper surface of the base housing, said cover being movable relative to said base housing between a first pin insertion position and a second pin engagement position, said cover having oppositely facing upper and lower surfaces with a plurality of through holes extending between said upper and lower surfaces and arranged in an array generally corresponding to the pin terminal array to facilitate receiving said pin terminals in said through holes, one of said cover and said base housing further including a metal component adjacent an end thereof, said metal component having an opening and a metal component stop member adjacent said opening; a plurality of conductive terminals for interconnecting said circuit member to said device, one of said terminals being mounted in each of said cavities; and a rotatable actuator, said actuator being operable to slide the cover relative to said base housing between a first insertion position at which said cover is positioned relative to said base housing to receive said pin terminals inserted into said through holes in said cover without significantly engaging said terminals and a second engagement position at which said pin terminals inserted into said through holes in said cover engage said terminals, said actuator having an actuator stop member configured to engage said metal component stop member upon rotation of said actuator in order to prevent rotation of said actuator past a predetermined angular position and thus limit linear motion of said cover relative to said base housing.

2. The electrical connector of claim 1 wherein said base housing includes a metal component extending along one end of said base housing and being spaced from said terminal-receiving cavities, said metal component including an opening therein configured for engagement by said actuator.

3. The electrical connector of claim 2 wherein said metal component further includes arms extending along opposite sides of said base housing, said arms being spaced from said terminal-receiving cavities.

4. The electrical connector of claim 1 wherein said cover includes guide structure that interacts with edges of the base member to guide said cover between said first insertion position and said second engagement position.

5. The electrical connector of claim 1 wherein said cover includes said metal component and an insulative component, and wherein said metal component of said cover and said insulative component of said cover are both generally planar.

6. The electrical connector of claim 1 wherein said cover includes a generally planar layer of sheet metal and a generally planar layer of insulative material.

7. The electrical connector of claim 6 wherein said cover further includes a second metal component, said second metal component extends along one end of said cover and is spaced from said through holes, said second metal component further including a cam follower surface configured to engage said actuator.

8. The electrical connector of claim 1 wherein said actuator is composed of metal.

9. The electrical connector of claim 1 wherein said metal component stop member is a projection on said cover adjacent said opening.

10. The electrical connector of claim 9 wherein said projection extends into said opening.

11. A zero insertion force electrical connector for mounting on a circuit member and receiving a device having a pin terminal array, said electrical connector comprising:

a base housing, said base housing having an upper surface and a lower surface and a plurality of terminal-receiving cavities arranged in a terminal-receiving cavity array generally corresponding to the pin terminal array;

a generally planar cover mounted on said upper surface of the base housing, said cover being movable relative to said base housing between a first insertion position and a second engagement position, said cover having oppositely facing upper and lower surfaces with a plurality of through holes extending between said upper and lower surfaces and arranged in an array generally corresponding to the pin terminal array to facilitate receiving pin terminals of said pin terminal array in said through holes;

one of said cover and said base housing further including an opening and a stop projection adjacent said opening;

a plurality of conductive terminals for interconnecting said circuit member to said device, one of said terminals being mounted in each of said cavities; and a rotatable actuator, said actuator being operable to slide the cover relative to said base housing between a first insertion position at which said cover is positioned relative to said base housing to receive said pin terminals into said through holes in said cover without significantly engaging said terminals and a second engagement position at which said pin terminals inserted into said through holes in said cover engage said terminals, said actuator having an axis of rotation generally perpendicular to the plane of said cover, said actuator further including a vertical insertion slot configured to engage said stop projection upon rotation of said actuator in order to prevent rotation of said actuator past a predetermined angular position and thus limit linear motion of said cover relative to said base housing.

12. The electrical connector of claim 11 wherein one of said cover and said base housing further include a metal component adjacent one end thereof and said opening is located in said metal component.

13. The electrical connector of claim 11 wherein said base housing includes a metal component extending along one end of said base housing and being spaced from said terminal-receiving cavities, said metal component including an opening therein configured for engagement by said actuator.

14. The electrical connector of claim 13 wherein said metal component further includes arms extending along opposite sides of said base housing, said arms being spaced from said terminal-receiving cavities.

15. The electrical connector of claim 11 wherein said cover includes a generally planar layer of sheet metal and a generally planar layer of insulative material.

16. The electrical connector of claim 15 wherein said cover further includes a second metal component, said second metal component extends along one end of said cover and is spaced from said through holes, said metal component further including a cam follower surface configured to engage said actuator.

17. The electrical connector of claim 11 wherein said actuator is composed of metal.

18. The electrical connector of claim 11 wherein said stop projection is on said cover adjacent said opening.

19. The electrical connector of claim 11 wherein said stop projection extends into said opening.

20. A zero insertion force electrical connector for mounting on a circuit member and receiving a device having a pin terminal array of conductive pin terminals, said electrical connector comprising:

a base housing, said base housing having an upper surface and a lower surface and a plurality of terminal-receiving cavities arranged in a terminal-receiving cavity array generally corresponding to the pin terminal array;

a generally planar cover mounted on said upper surface of the base housing, said cover being movable relative to said base housing between a first insertion position and a second engagement position, said cover having oppositely facing upper and lower surfaces with a plurality of through holes extending between said upper and lower surfaces and arranged in an array generally corresponding to the pin terminal array to facilitate receiving said pin terminals in said through holes, one of said cover and said base housing further including a mounting region;

a plurality of conductive terminals for interconnecting said circuit member to said device; and an actuator rotatably mounted at said mounting region and configured to slide the cover relative to said base housing between a first insertion position at which said cover is positioned relative to said base housing to receive said pin terminals inserted into said through holes in said cover without significantly engaging said terminals and a second engagement position at which said pin terminals inserted into said through holes in said cover engage said terminals, said actuator having an axis of rotation generally perpendicular to the plane of said cover, said actuator includes orientation structure and said mounting region includes a complementary orientation structure to prevent said actuator from being inserted into said mounting region when said actuator is oriented at certain predetermined angular orientations.

21. The electrical connector of claim 20 wherein one of said terminals is mounted in each of said cavities.

22. The electrical connector of claim 20 wherein said orientation structure includes a ridge projection on one of said actuator and said mounting region.

23. The electrical connector of claim 22 wherein said actuator includes said ridge projection and said mounting region includes a notch portion for receiving said projection whereby said actuator may only be inserted into said mounting region when said actuator is oriented at certain predetermined angular orientations.

24. The electrical connector of claim 20 wherein one of said cover and said base housing further include a metal component adjacent one end thereof and said mounting region includes an opening located in said metal component.

25. The electrical connector of claim 20 wherein said base housing includes a metal component extending along one end of said base housing and being spaced from said terminal-receiving cavities, said metal component including an opening therein configured for engagement by said actuator.

26. The electrical connector of claim 20 wherein said cover includes a generally planar layer of sheet metal and a generally planar layer of insulative material.

27. The electrical connector of claim 26 wherein said cover further includes a second metal component, said second metal component extends along one end of said cover and is spaced from said through holes, said second metal component further including a cam follower surface configured to engage said actuator.

28. The electrical connector of claim 20 wherein said actuator is composed of metal.

* * * * *